United States Patent
Addepalli et al.

(10) Patent No.: US 9,563,213 B2
(45) Date of Patent: Feb. 7, 2017

(54) ON CHIP ZQ CALIBRATION RESISTOR TRIMMING

(71) Applicant: SanDisk Technologies Inc., Plano, TX (US)

(72) Inventors: Sravanti Addepalli, Bengaluru (IN); Sridhar Yadala, Bengaluru (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/966,891

(22) Filed: Dec. 11, 2015

(65) Prior Publication Data

US 2016/0182044 A1  Jun. 23, 2016

Related U.S. Application Data

(60) Provisional application No. 62/093,307, filed on Dec. 17, 2014.

(51) Int. Cl.
| | |
|---|---|
| *H03K 19/003* | (2006.01) |
| *H03K 17/16* | (2006.01) |
| *G05F 1/46* | (2006.01) |
| *G11C 16/06* | (2006.01) |
| *H03K 19/00* | (2006.01) |

(52) U.S. Cl.
CPC ............ *G05F 1/463* (2013.01); *G11C 16/06* (2013.01); *H03K 19/0005* (2013.01)

(58) Field of Classification Search
CPC ...... H03K 19/0005; G11C 16/06; G11C 11/34
USPC ...... 326/30, 34, 87; 327/108, 112, 306, 309; 365/189.05, 189.07
See application file for complete search history.

(56) References Cited

U.S. PATENT DOCUMENTS

| | | | |
|---|---|---|---|
| 6,275,090 B1 | 8/2001 | Burger, Jr. et al. | |
| 6,307,791 B1 * | 10/2001 | Otsuka ................. | G11C 7/1051 326/30 |
| 6,839,286 B2 * | 1/2005 | Cho ....................... | G11C 16/06 365/189.05 |
| 7,154,421 B2 | 12/2006 | Devendorf et al. | |
| 7,218,155 B1 * | 5/2007 | Chang ................. | H03K 19/0005 326/30 |
| 7,782,080 B2 | 8/2010 | Eaton | |
| 7,973,553 B1 * | 7/2011 | Wang ................. | H04L 25/0278 326/30 |

(Continued)

*Primary Examiner* — Daniel D Chang
(74) *Attorney, Agent, or Firm* — Vierra Magen Marcus LLP

(57) ABSTRACT

Techniques for trimming an on chip ZQ calibration resistor are disclosed. The on chip ZQ calibration resistor alleviates the need for an external ZQ calibration resistor. The on chip ZQ calibration resistor allows for a faster ZQ calibration. The trimming of on chip ZQ calibration resistor may be used to account for process variation. A correction mechanism may be used to account for temperature variation. Some of the circuitry that is used for ZQ calibration is also used for trimming the on-chip calibration resistor. This circuitry may include operational amplifiers, current mirrors, transistors, etc. The dual use of the circuitry can eliminate offset errors in an operational amplifier. The dual use can eliminate current mirror mismatch. Therefore, the trimming accuracy may be improved. The dual use also reduces the amount of circuitry that is needed for trimming the on chip ZQ calibration resistor. Thus, transistor count and chip size is reduced.

20 Claims, 14 Drawing Sheets

(56) References Cited

U.S. PATENT DOCUMENTS

| | | |
|---|---|---|
| 8,179,151 B2 | 5/2012 | Jasa et al. |
| 8,710,904 B2 | 4/2014 | Polley |
| 2009/0267693 A1 | 10/2009 | Chandra et al. |

\* cited by examiner

ON CHIP ZQ CALIBRATION RESISTOR TRIMMING

CLAIM OF PRIORITY

The present application claims priority from U.S. Provisional Patent Application No. 62/093,307, entitled "ON CHIP ZQ CALIBRATION," by Addepalli et al., filed Dec. 17, 2014, incorporated by reference herein in its entirety.

BACKGROUND

The present technology relates to semiconductors.

Most semiconductor devices include an input circuit configured to receive signals from the outside world via input pads (or pins) and an output circuit configured to provide internal signals to the outside via output pads (or pins). The input circuit has a termination resistor for impedance matching of the external transmission line. The output circuit has an output driver, which has a resistance (Rory). The impedance of both the termination resistor and the output driver can change due to various circumstances such as variation of a power supply voltage, a change in operating temperature, etc. Thus, an impedance mismatch can arise.

The impedance mismatch can cause signal reflection, which can compromise signal integrity. As the operating speed of electrical products has increased, the swing width (that is the difference between high and low logic levels) of a signal interfaced between semiconductor devices gradually has been reduced in order to reduce supply current and to minimize the delay time taken for signal transmission. However, the reduction in the swing width of the signal easily exposes the signal to external noise, causing signal reflection to become more critical at an interface terminal due to impedance mismatch. Thus, the impedance mismatch may lead to difficulty in high-speed transmission of data and distortion of output data.

Weak output drivers may result in bad slopes on I/O signals. Strong output drivers may consume high currents and result in too much simultaneous switching noise (SSN) on power lines and I/O pins. Mismatch in pull up and pull down impedances also degrades signal integrity. Therefore, at high speeds, any deviation in output driver impedance from target impedance results in shrinking of eye aperture and may result in data transmission errors or losses.

To alleviate impedance mismatch, the device's output drivers and/or the device's termination resistors may be periodically calibrated. One calibration technique is referred to as a ZQ calibration. Conventionally, ZQ calibration may use a precision calibration resistor that is located off chip. The chip may have a variable impedance circuit which is calibrated with respect to the off chip resistor. The ZQ calibration adjusts the impedance of the variable impedance circuit until it is calibrated to the off chip resistor. This results in an impedance code that can be used to adjust the impedance of the device's output drivers or on-die termination circuitry.

DETAILED DESCRIPTION

Disclosed herein are techniques and apparatus for trimming an on chip ZQ calibration resistor. The on chip ZQ calibration resistor alleviates the need for an external ZQ calibration resistor. The on chip ZQ calibration resistor allows for a faster ZQ calibration. An off chip ZQ calibration resistor is typically connected to a pin or pad of the chip. Capacitance associated with this pin can significantly slow the ZQ calibration. Thus, the on chip ZQ calibration resistor can significantly speed up ZQ calibration. Also, with an on chip ZQ calibration resistor there is not a need for a pin or pad dedicated for an off chip ZQ calibration resistor.

In one embodiment, the resistance of an on chip ZQ calibration resistor is trimmed. The trimming may be used to account for variation in resistance due to the process of fabricating the on chip ZQ calibration resistor. A temperature correction mechanism may be used in one embodiment to account for variation in resistance due to temperature fluctuations. In one embodiment, some of the circuitry that is used for ZQ calibration is also used for trimming the on-chip calibration resistor. This circuitry may include a comparator, operational amplifiers, current mirrors, transistors, etc. The dual use of the circuitry can eliminate offset errors in an operational amplifier. The dual use of the circuitry can eliminate offset errors in a comparator. The dual use can eliminate current mirror mismatch. For example, the dual use can eliminate errors due to mismatches in transistor sizes. Therefore, the trimming accuracy may be improved. The dual use also reduces the amount of circuitry that is needed for trimming the on chip ZQ calibration resistor. Thus, transistor count and chip size is reduced.

Figure 1:
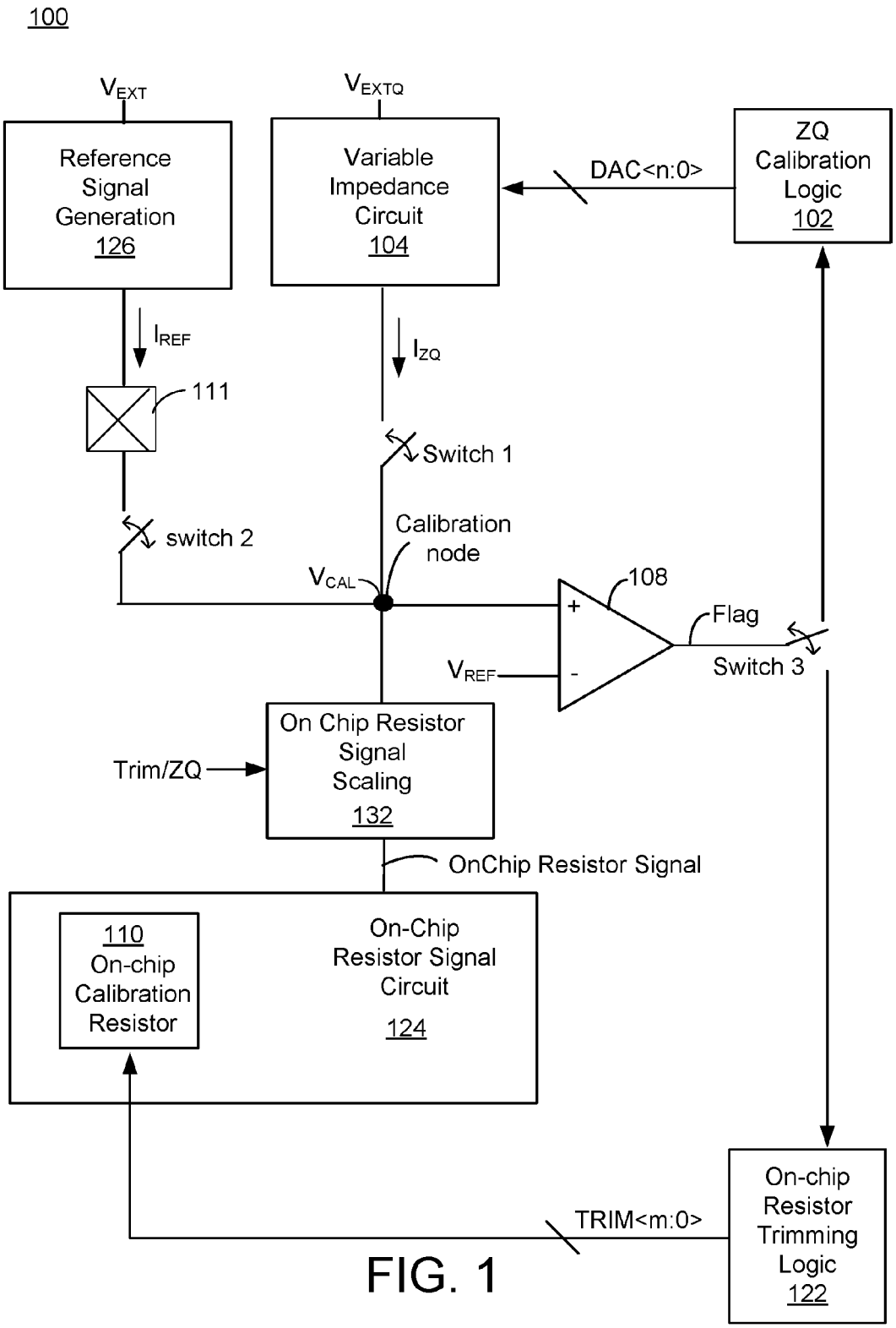
FIG. 1 is a diagram of one embodiment of a system that has an on-chip calibration resistor, which may be used when performing a ZQ calibration.

FIG. 1 is a diagram of one embodiment of a system 100 that has an on-chip calibration resistor 110, which may be used when performing a ZQ calibration. The system 100 is able to trim the on-chip calibration resistor 110. Trimming may be used to account for process variation, etc. Temperature correction may be used to account for temperature variation, etc. Some of the circuit components that are used when performing the ZQ calibration may also be used when trimming the on-chip calibration resistor 110. This provides for a more accurate trimming. It also saves chip real estate.

One of the circuit components that may be re-used is comparator 108. Comparator 108 has a first input (e.g., non-inverting input) coupled to a calibration node, and a second input (e.g., inverting input) that is provided with a reference voltage ($V_{REF}$). The comparator is used to compare the voltage at the calibration node (at its non-inverting input) with $V_{REF}$ (at its inverting input). In a mode in which ZQ calibration is being performed, a ZQ current ($I_{ZQ}$) may be provided to the calibration node by closing switch 1, which is connected to variable impedance circuit 104. In a mode in which trimming of the on-chip resistor 110 is being performed, a reference current ($I_{REF}$) may be provided to the calibration node by closing switch 2, which is connected to input pad 111. Input pad 111 is connected to reference signal generation 126. The input pad 111 could be replaced with an input pin. The input pad may be a test pad or a monitor pad which may be present on the chip for the testing of other circuitry.

Reference signal generation 126 is located off chip, in one embodiment. Note that the other elements (102, 104, 108, 110, 124, 122, and 132) are all located on chip, in one embodiment. In one embodiment, the chip is a non-volatile storage device (memory cells not depicted in FIG. 1). Reference signal generation 126 may be a high precision current source. Reference signal generation 126 is provided with an external voltage ($V_{EXT}$), which could have the same magnitude or a different magnitude relative to $V_{SUPPLY}$.

The calibration voltage ($V_{CAL}$) may be generated based on a current through the on-chip calibration resistor 110. The magnitude of $V_{CAL}$ may also be impacted by the impedance of variable impedance circuit 104 during ZQ calibration. The magnitude of $V_{CAL}$ may also be impacted by $I_{REF}$ during on-chip resistor trimming.

In one embodiment, the current through the on-chip calibration resistor 110 is scaled and provided to the calibration node, at least once calibration (ZQ or on chip resistor trimming) is complete. This may be referred to as a calibration current. However, note that the magnitude of the calibration current could be different for ZQ calibration than for trimming the on-chip resistor 110. Stated another way, the magnitude of $I_{ZQ}$ may be different from $I_{REF}$. Thus, the system optionally has on-chip resistor signal scaling 132, which scales the on-chip resistor signal appropriately. On-chip resistor signal scaling 132 has an input Trim/ZQ signal, whose value indicates whether the system is in trim mode or ZQ mode.

As stated, the comparator 108 compares the voltage at the calibration node with $V_{REF}$. The comparator 108 outputs a flag based on the comparison. When ZQ calibration is being performed, the flag is provided to ZQ calibration logic 102 by appropriate setting of switch 3. When trimming of the on-chip resistor 110 is being performed, the flag is provided to on-chip resistor trimming logic 122 by appropriate setting of switch 3. Comparator 108 may be implemented by an operational amplifier. The operational amplifier may have an offset associated with it. By using the comparator 108 for both ZQ calibration and on-chip resistor trimming, ZQ calibration accuracy is improved by eliminating inaccuracy due to offset errors.

On-chip resistor signal circuit 124 is used to generate an on-chip resistor signal using the on-chip calibration resistor 110. In one embodiment, the on-chip resistor signal circuit 124 comprises at least one operational amplifier. One or more of the operational amplifiers may be used during both ZQ calibration and on-chip resistor trimming. This improves accuracy by, for example, eliminating inaccuracy due to offset.

In one embodiment, the on-chip resistor signal circuit 124 comprises at least one current mirror. A current mirror can comprise two or more transistors. A current mirror can generate a mirrored version of a current based on characteristics of the two or more transistors, such as the size of the transistors. Here the size could be factors such as length, width, length to width ratios, etc. Thus, the ability of the current mirror to accurately mirror a current may depend on characteristics of its transistors. It can be difficult to fabricate transistors having precise characteristics such as size (e.g., length, width, etc.). One or more current mirrors may be used during both ZQ calibration and on-chip resistor trimming, which improves accuracy.

As noted above, variable impedance circuit 104 outputs a ZQ current ($I_{ZQ}$). The ZQ calibration logic 102 outputs an impedance code (DAC<n:0>) to the variable impedance circuit 104. In this example, the impedance code has n+1 bits. The variable impedance circuit 104 adjusts its impedance based on the impedance code. Variable impedance circuit 104 is provided with a supply voltage ($V_{EXTQ}$). In one embodiment, the reference voltage ($V_{REF}$) has a magnitude that is one half the magnitude of the $V_{EXTQ}$. ZQ calibration logic 102 may be implemented in a variety of ways, including but not limited to, a state machine, a processor, digital logical, or a combination of any of these elements. The processor may execute instructions that are stored on computer readable storage.

Figure 6A:
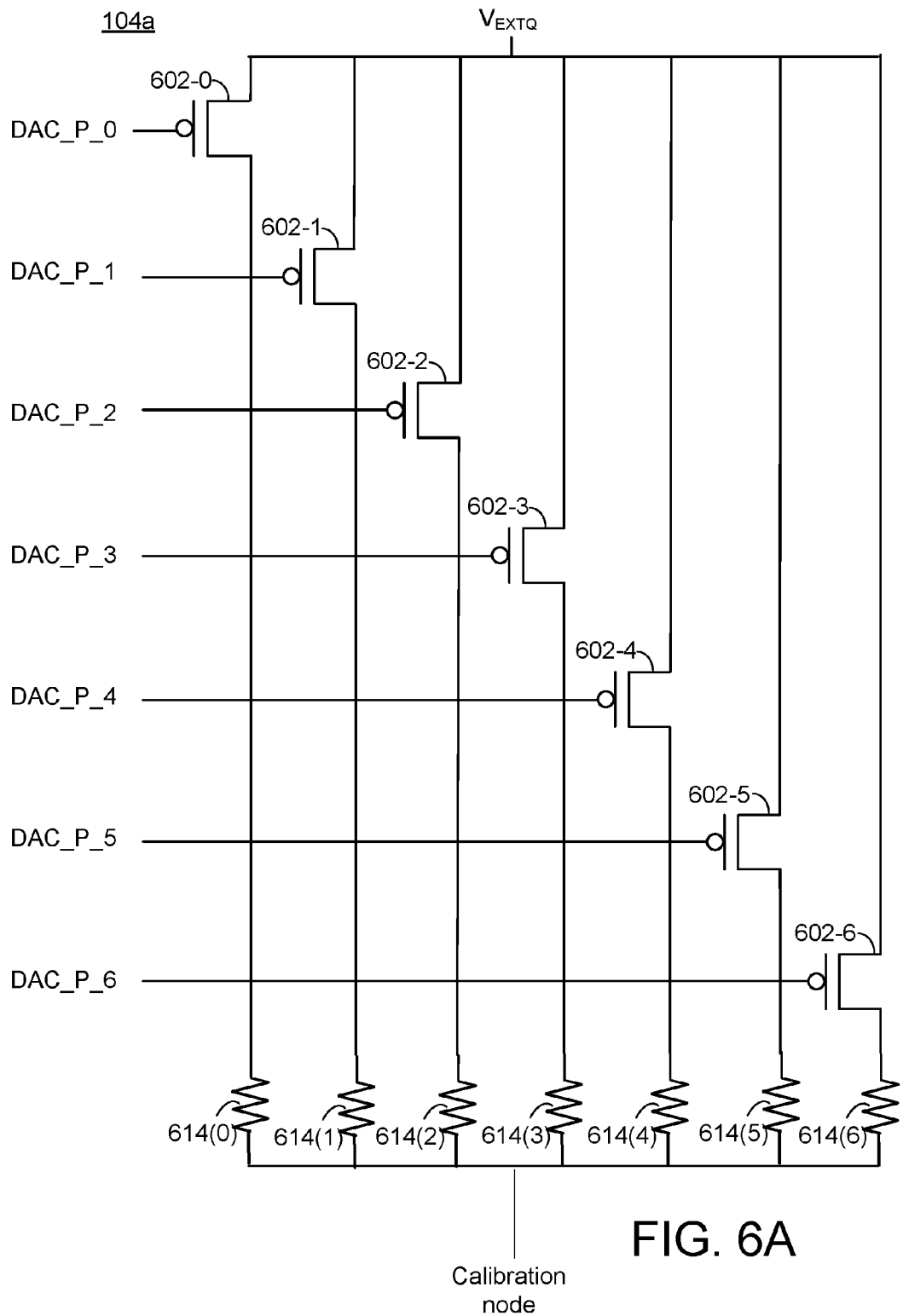
FIG. 6A depicts one embodiment of the variable impedance circuit of FIG. 1.

The variable impedance circuit 104 may comprise a number of circuit elements, such as transistors and resistors. The variable impedance circuit 104 turns those transistors on or off in response to the value of the impedance code (DAC) to alter the impedance of the variable impedance circuit 104, in one embodiment. In one embodiment, variable impedance circuit 104 is a binary weighted transistor circuit. In one embodiment, the variable impedance circuit 104 is configured to have $2^{n+1}$ different impedances in response to the different values of an "n+1" bit impedance code (DAC). FIG. 6A provides further details of one embodiment of the variable impedance circuit 104.

On-chip resistor signal circuit 124 outputs an on-chip resistor signal. In one embodiment, the on-chip resistor signal is a current. The magnitude of the current may depend on the impedance of on-chip calibration resistor 110. In one embodiment, the on-chip resistor signal is a voltage. The on-chip resistor trimming logic 122 outputs a trim code (TRIM<m:0>) to the on-chip calibration resistor 110. In this example, the trim code has m+1 bits. The on-chip calibration resistor 110 adjusts its impedance based on the trim code. On-chip resistor trimming logic 122 may be implemented in a variety of ways, including but not limited to, a state machine, a processor, digital logical, or a combination of any of these elements. The processor may execute instructions that are stored on computer readable storage.

Figure 3A:
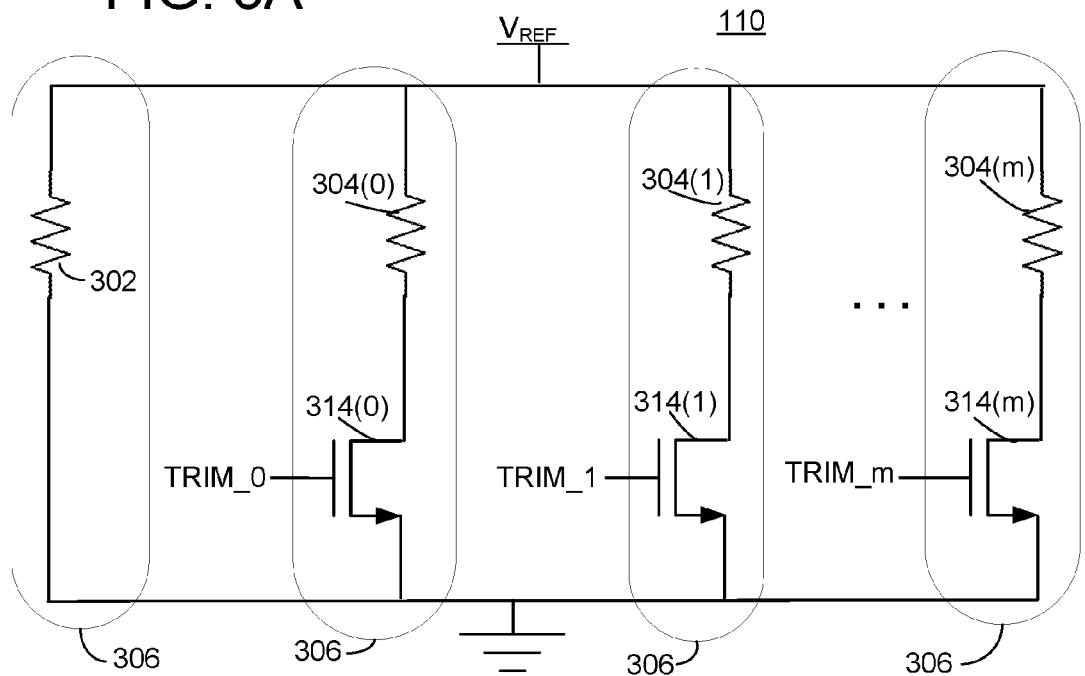
FIG. 3A, FIG. 3B, and FIG. 3C depict embodiments of an on-chip calibration resistor.
Figure 3B:
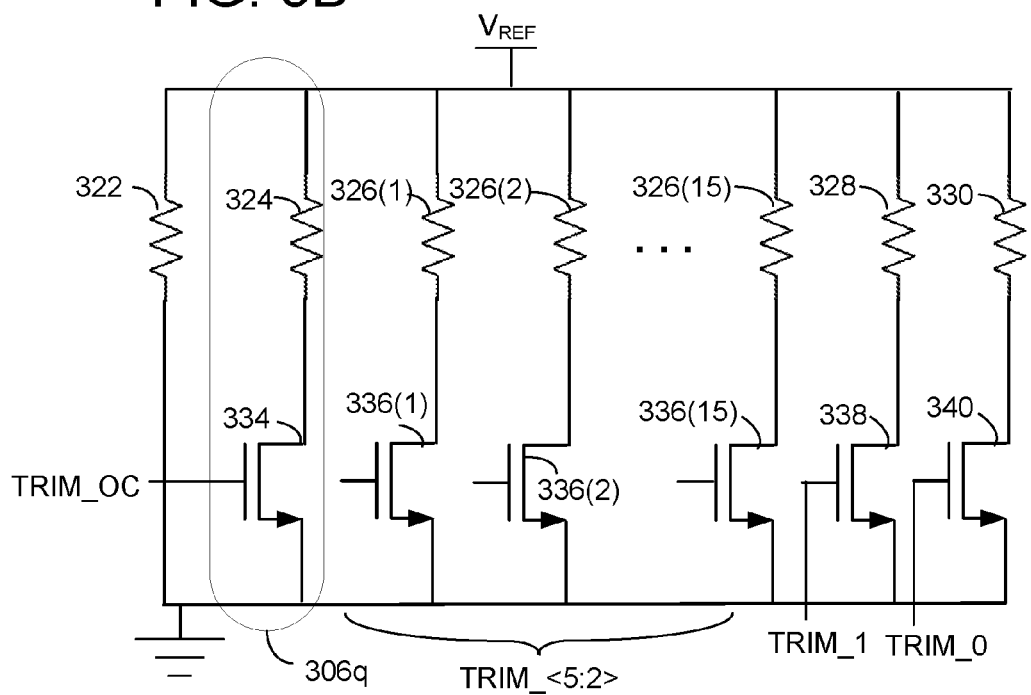
Figure 3C:
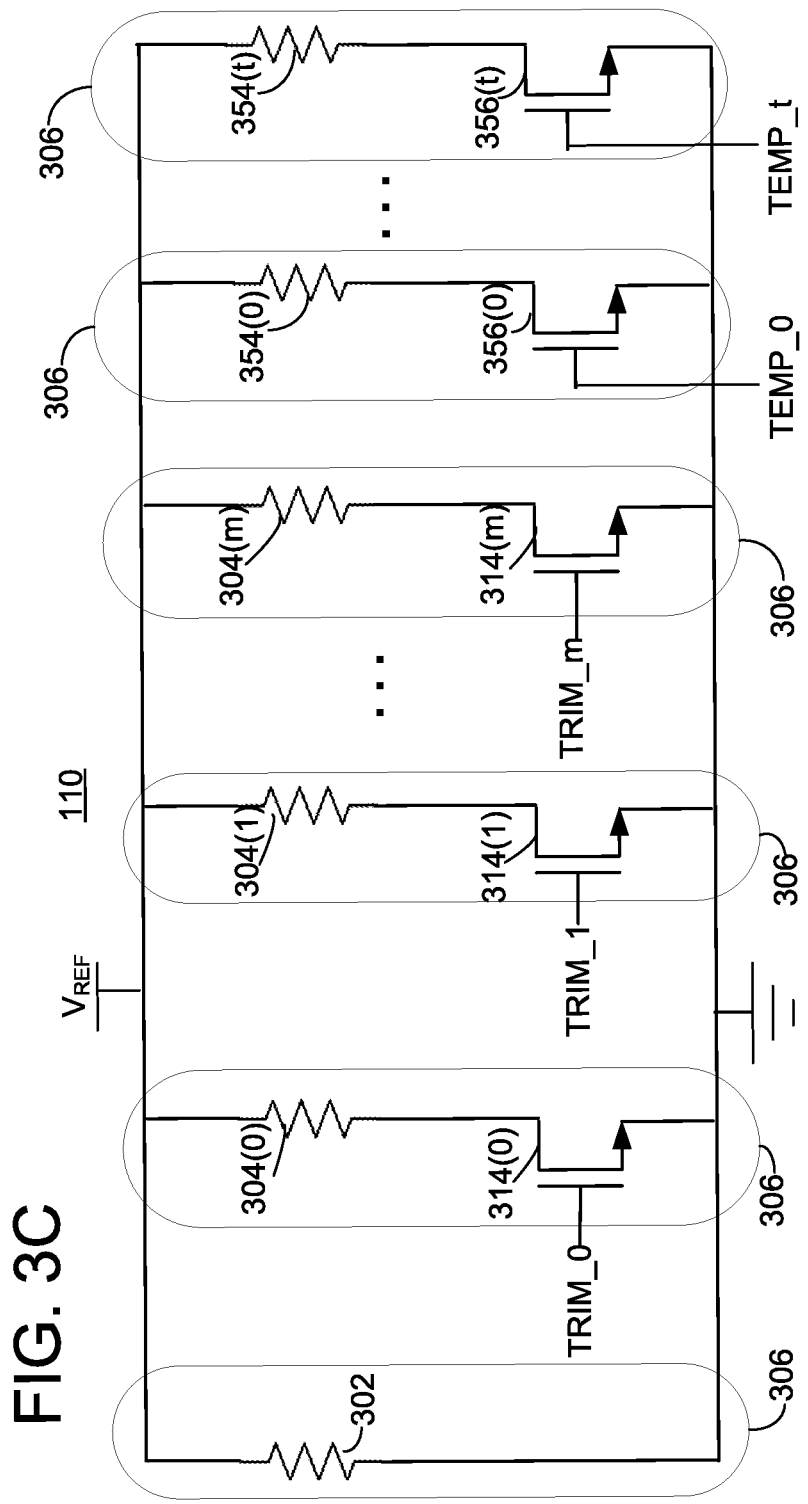

The on-chip calibration resistor 110 may comprise a number of circuit components, such as resistors and transistors. The on-chip calibration resistor 110 turns those transistors on or off in response to the value of the trim code to alter the impedance of the on-chip calibration resistor 110, in one embodiment. In one embodiment, on-chip calibration resistor 110 is a binary weighted transistor circuit. In one embodiment, the on-chip calibration resistor 110 is configured to have $2^{m+1}$ different impedances in response to the different values of an "m+1" bit trim code. FIGS. 3A, 3B, and 3C provide further details of various embodiments of the on-chip calibration resistor 110.

Figure 2A:
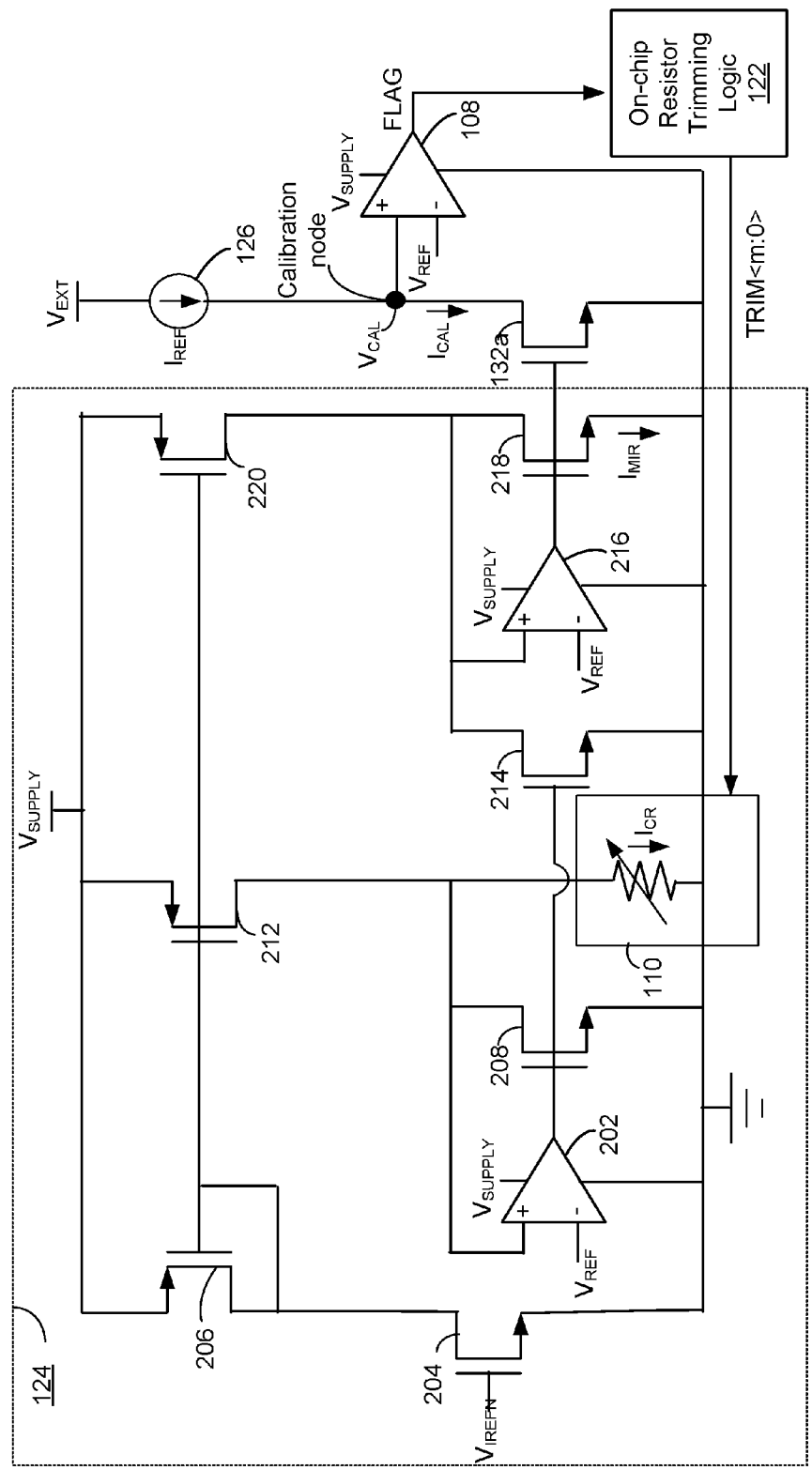
FIG. 2A is a diagram of one embodiment of circuitry that may be used in the system of FIG. 1 when trimming the on-chip calibration resistor.

FIG. 2A depicts circuitry that includes one embodiment of on-chip resistor signal circuit 124, on-chip resistor signal scaling 132a, reference current 126, comparator 108, and on-chip resistor trimming logic 122.

In general, the circuitry applies a reference voltage $V_{REF}$ across the on-chip calibration resistor 110. This creates current $I_{CR}$ in the on-chip calibration resistor 110. The circuit generates current $I_{MIR}$ in transistor 218 based on current $I_{CR}$. In one embodiment, $I_{MIR}$ has the same magnitude as $I_{CR}$. Note that $I_{MIR}$ could have the same magnitude or could be a scaled (up or down) version of $I_{CR}$. The gate of transistor 132a is tied to the gate of transistor 218, and the source of both transistors 218, 132a are connected to ground. The current $I_{MIR}$ is one example of the on-chip resistor signal of FIG. 1. The gate to source voltage of transistor 218 is another example of the on-chip resistor signal of FIG. 1.

The drain of transistor 132a is connected to the non-inverting input of comparator 108. During calibration, $I_{CAL}$ may be essentially equal to $I_{REF}$. Note that there may be some very small amount of current into the comparator 108. However, this current may be so small such that $I_{CAL}$ may be essentially equal to $I_{REF}$. Note that the drain to source voltage of transistor 132a may change during the trimming process. The current through transistor 132a depends on its gate to source voltage and its drain to source voltage. For a given gate to source voltage, and given drain current ($I_{CAL}=I_{REF}$), transistor 132a generates an appropriate drain voltage. Thus, the drain of transistor 132a may provide a calibration voltage ($V_{CAL}$) to the calibration node. The magnitude of $V_{CAL}$ may depend on $I_{MIR}$ (or on the gate to source voltage of transistor 218).

When trimming is complete, the drain of transistor 132a may be at $V_{REF}$. At this point, the drain to source voltages of transistors 218 and 132a may match (Both may be equal to $V_{REF}$). Hence, the calibration current $I_{CAL}$ may be a scaled version (up or down) of $I_{MIR}$. However, another possibility is for the calibration current $I_{CAL}$ to have the same magnitude as $I_{MIR}$.

Comparator 108 is provided with a reference voltage ($V_{REF}$) at its inverting input. Comparator 108 compares the calibration voltage ($V_{CAL}$) at the calibration node with $V_{REF}$ and outputs the signal FLAG based on the comparison. The comparator 108 may compare the magnitude of the voltages at its inverting and non-inverting inputs, and output a value of FLAG based thereon.

FLAG is provided to the on-chip resistor trimming logic 122, which generates a trim code (TRIM<m:0>) based on the value of FLAG. The trim code is provided to the on-chip calibration resistor 110, which changes its resistance based on the value of the trim code. Further details are discussed below.

Now that an overview of the circuitry has been provided, further details will be discussed. The reference voltage $V_{REF}$ may be provided to the on-chip calibration resistor 110 by operational amplifier 202 and transistors 208, 212, 206 and 204. Operational amplifier 202 is supplied with $V_{REF}$ it its inverting input. The non-inverting input of operational amplifier 202 is connected to one terminal of the on-chip calibration resistor 110. The other terminal of the on-chip calibration resistor 110 is at ground. The gate of transistor 208 is connected to the output of operational amplifier 202. The drain of transistor 208 is connected to non-inverting input of operational amplifier 202. The source of transistor 208 is connected to ground. In this configuration, the voltage at the non-inverting input of operational amplifier 202 is held at $V_{REF}$. Thus, $V_{REF}$ is provided across the terminals of the on-chip calibration resistor 110.

Transistor 204 acts as a constant current source by application of voltage $V_{IREFN}$. In one embodiment, $V_{IREFN}$ is an analog voltage which is generated from circuitry that ensures constant current through 204 on the application of $V_{IREFN}$ at its gate. PMOS transistor 206 and PMOS transistor 212 form a current mirror with their gates tied together and sources connected to the supply voltage $V_{SUPPLY}$. Thus, a version of the current in transistor 204 is mirrored to transistor 212. By a "version of the current" it is meant that the current may be scaled up in magnitude, scaled down in magnitude, or may have the same magnitude. However, regardless of the scaling, the mirrored current depends on the current that it is mirroring. The drain of PMOS transistor 212 is connected to the node at which the upper terminal of the on-chip calibration resistor 110, the drain of transistor 208, and the non-inverting input of operational amplifier 202 meet. Thus, the current from PMOS transistor 212 is split between the on-chip calibration resistor 110 and transistor 208.

Operational amplifier 216 is supplied with $V_{REF}$ at its inverting input. The non-inverting input of operational amplifier 216 is connected to the drain of n-channel transistor 218. The source of n-channel transistor 218 is grounded. The gate of n-channel transistor 218 is connected to the output of operational amplifier 216. In this configuration, the voltage at the non-inverting input of operational amplifier 216 is held at $V_{REF}$. Thus, $V_{REF}$ is provided across n-channel transistor 218. A purpose of having the operational amplifier 216 is to maintain the same $V_{DS}$ for the current mirror pairs: 212/220, 208/214 and 218/132. $V_{DS}$ of transistor 218 and transistor 132a are matched only when trimming the on-chip resistor 110 is complete, in one embodiment. That is, $V_{DS}$ of transistor 218 and transistor 132a are matched only when the voltage level of calibration node equals $V_{REF}$. In one embodiment, n-channel transistor 218 is configured (given the configuration of other circuit components) to have a current that is equal in magnitude to $I_{CR}$. However, other circuit configurations are possible. For example, the current in n-channel transistor 218 could be scaled up or down (relative to $I_{CR}$) by appropriate selection of transistor sizes.

N-channel transistor 214 has its gate connected to the output of operational amplifier 202 and its drain connected to the non-inverting input of operational amplifier 216. The source of n-channel transistor 214 is grounded. In one embodiment, n-channel transistor 214 and n-channel transistor 208 are configured to have the same current. However, other circuit configurations are possible.

P-channel transistor 220 has its gate connected to the gates of p-channel transistors 206 and 212. The source of p-channel transistor 220 is connected to $V_{SUPPLY}$. Thus, p-channel transistor 220 may form part of a current mirror with transistors 206 and 212. In one embodiment, transistors 206, 212, and 220 are configured to have the same current magnitude. However, other circuit configurations are possible. The current from PMOS transistor 220 is split between transistor 218 and transistor 214.

In one embodiment, the current in transistors 212 and 220 are the same magnitude. Likewise, the current in transistors 208 and 214 are the same magnitude, in one embodiment. Recall that the current in transistor 212 is split between on-chip calibration resistor 110 and transistor 208. Recall also that the current in transistor 220 is split between transistor 218 and transistor 214. Therefore, the current in transistor 218 will equal the current in the on-chip calibration resistor 110, in one embodiment.

Figure 2B:
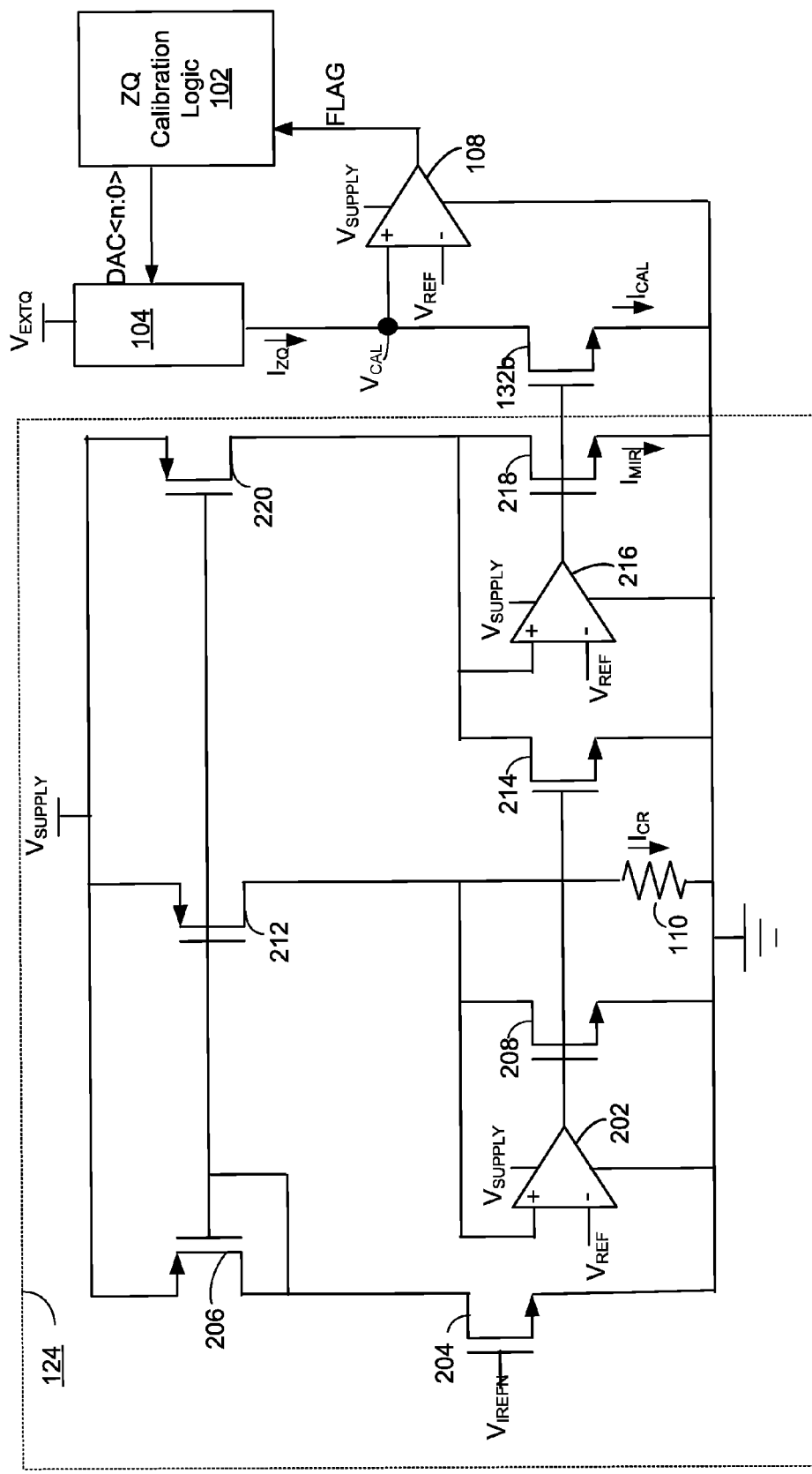
FIG. 2B is a diagram of one embodiment of circuitry that may be used in the system of FIG. 1 when performing ZQ calibration.

FIG. 2B depicts circuitry that includes one embodiment of on-chip resistor signal circuit 124, on-chip resistor signal scaling 132b, variable impedance circuit 104, comparator 108, and ZQ calibration logic 102. On chip resistor signal circuit 124 is the same as in the circuit of FIG. 2A, in one embodiment. That is, all of the circuit components in on chip resistor signal circuit 124 are the same circuit components, in one embodiment. The comparator 108 in the circuit of FIG. 2B is the same comparator 108 as in the circuit of FIG. 2A, in one embodiment. Thus, on chip resistor signal circuit 124 and comparator 108 are re-used for on-chip calibration resistor trimming and ZQ calibration, in one embodiment.

Referring now to the circuit of FIG. 2B, comparator 108 is provided with a reference voltage ($V_{REF}$) at its inverting input. The comparator 108 may compare the magnitude of the voltages at its inverting and non-inverting inputs, and output a value of FLAG based thereon.

FLAG is provided to the ZQ calibration logic 102, which generates a DAC code (DAC<n:0>) based on the value of FLAG. The DAC code is provided to the variable impedance circuit 104, which changes its impedance based on the value of the DAC code. The voltage $V_{CAL}$ at the calibration node may change in response to the impedance of the variable impedance circuit 104 and the magnitude of $I_{CAL}$. The voltage on calibration node ($V_{CAL}$) may impact both $I_{ZQ}$ and $I_{CAL}$. The calibration node may settle at a voltage level such that these two currents are equal. Note that $I_{CAL}$ may essentially be equal to $I_{ZQ}$. Further details are discussed below.

$V_{DS}$ of transistor 218 and transistor 132b are matched only when ZQ calibration is complete. That is, $V_{DS}$ of transistor 218 and transistor 132b are matched only when the voltage level of calibration node equals $V_{REF}$.

As already noted, the magnitude of the calibration current $I_{CAL}$ when performing ZQ calibration may be different than when trimming the on chip calibration resistor 110. Transistor 132b has a suitable size to generate a suitable magnitude for $I_{CAL}$ when performing ZQ calibration. The gate of transistor 132b is connected to the gate of transistor 218 (as well as the output of operational amplifier 216). The source of transistor 132b is grounded. The drain of transistor 132b is connected to the non-inverting input of comparator 108 in order to provide the calibration current $I_{CAL}$ to the calibration node.

Note that in the circuits of FIGS. 2A and 2B, there may be relatively high currents, and relatively large transistor sizes. These factors mean that elements that are depicted as being at the same node might not actually have actually the same voltage, due to IR drop over routing connections. For example, the drain of transistor 208, one end of the on-chip calibration resistor 110 and the non-inverting input of operational amplifier 202 are each connected to the same node. However, due to IR drops over electrical connections, those points of those elements may not actually have the same voltage. However, by embodiments using the same circuit for resistor trimming and ZQ calibration, the difference voltages on those internal nodes does not present a problem. In one embodiment, regardless of the IR drop issue, the final $I_{MIR}$ is accurately provided.

Figure 2C:
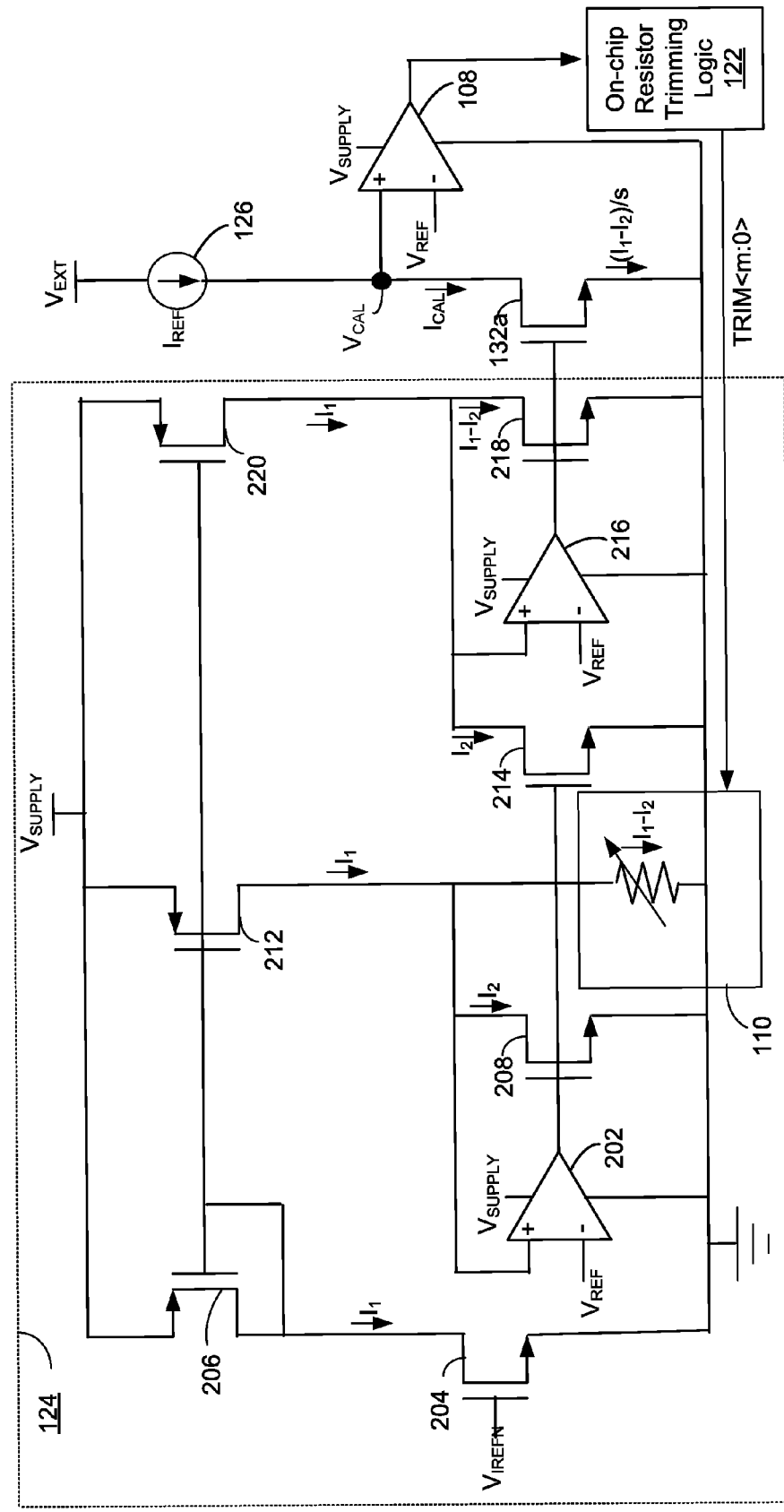
FIG. 2C depicts the circuitry of FIG. 2A with example currents.

FIG. 2C depicts the circuit of FIG. 2A with example current magnitudes, in accordance with one embodiment. Note that the currents are for the condition when trimming has been complete. During calibration of the on-chip calibration resistor 110, the relative value of the current through transistor 132a to the currents in circuit 124 does not necessarily hold. For example, $I_{CAL}$ may be essentially equal to $I_{REF}$ during trimming. A current having magnitude $I_1$ flows through transistors 204 and 206. A current having magnitude $I_1$ also flows through transistors 212 and 220. That is, the magnitude of the current in transistors 212 and 220 is the same as the magnitude of the current in transistors 204 and 206. For example, the current from transistor 206 is mirrored in transistors 212 and 220.

As already noted, the current from transistor 212 is split between the on-chip calibration resistor 110 and transistor 208. This results in current having magnitude $I_2$ flowing through transistor 208. Therefore, the on-chip calibration resistor 110 has current with a magnitude $I_1$-$I_2$.

Transistor 214 has a current having magnitude h. For example, transistor 214 has the appropriate size to result in a current having the same magnitude as the current in transistor 208. As already noted, the current from transistor 220 is split between transistor 218 and transistor 214. Therefore, transistor 218 has current with a magnitude $I_1$-$I_2$. Thus, the current of transistor 218 has the same magnitude as the current in the on-chip calibration resistor 110, in this example.

The current in transistor 132a has a magnitude $(I_1-I_2)/s$. The value "s" may be selected to generate a current of suitable magnitude for performing trimming of the on-chip calibration resistor 110. The relative sizes of transistor 132a to transistor 218 may be designed based on requirement of "s". A reason for having a current scaling factor is to reduce the requirement of $I_{REF}$ which may be a tester/testing hardware (pin/probe) limitation. Secondly, this may be done to keep the IR drops associated with 132a low. The scaling factor "s" should not be too large, as it may impact the current mirror (218/132a) accuracy.

The following values are examples for purpose of illustration. All values could be higher or lower. The current through the on-chip calibration resistor 110 may be 0.75 mA. The value of $V_{REF}$ may be 0.9V. The on-chip calibration resistor 110 may be trimmed to have a resistance of 1200 Ohms. Note that this value is significantly higher than the 300 Ohms that is typically used for an off-chip ZQ calibration resistor. This higher resistance reduces the resistor implementation area. This can increase the accuracy of the on-chip resistor. This may also reduce internal branch currents during ZQ calibration. The value of "s" is 24, as one example. This results in a calibration current $I_{CAL}$ of about 31.25 micro amperes after trimming, in this example. The reference current is also 31.25 micro amperes, in this example. As noted above, the reference current $I_{REF}$ may be provided by a high precision source that is external to the chip. However, the reference current is not required to be provided from source external to the chip.

Figure 2D:
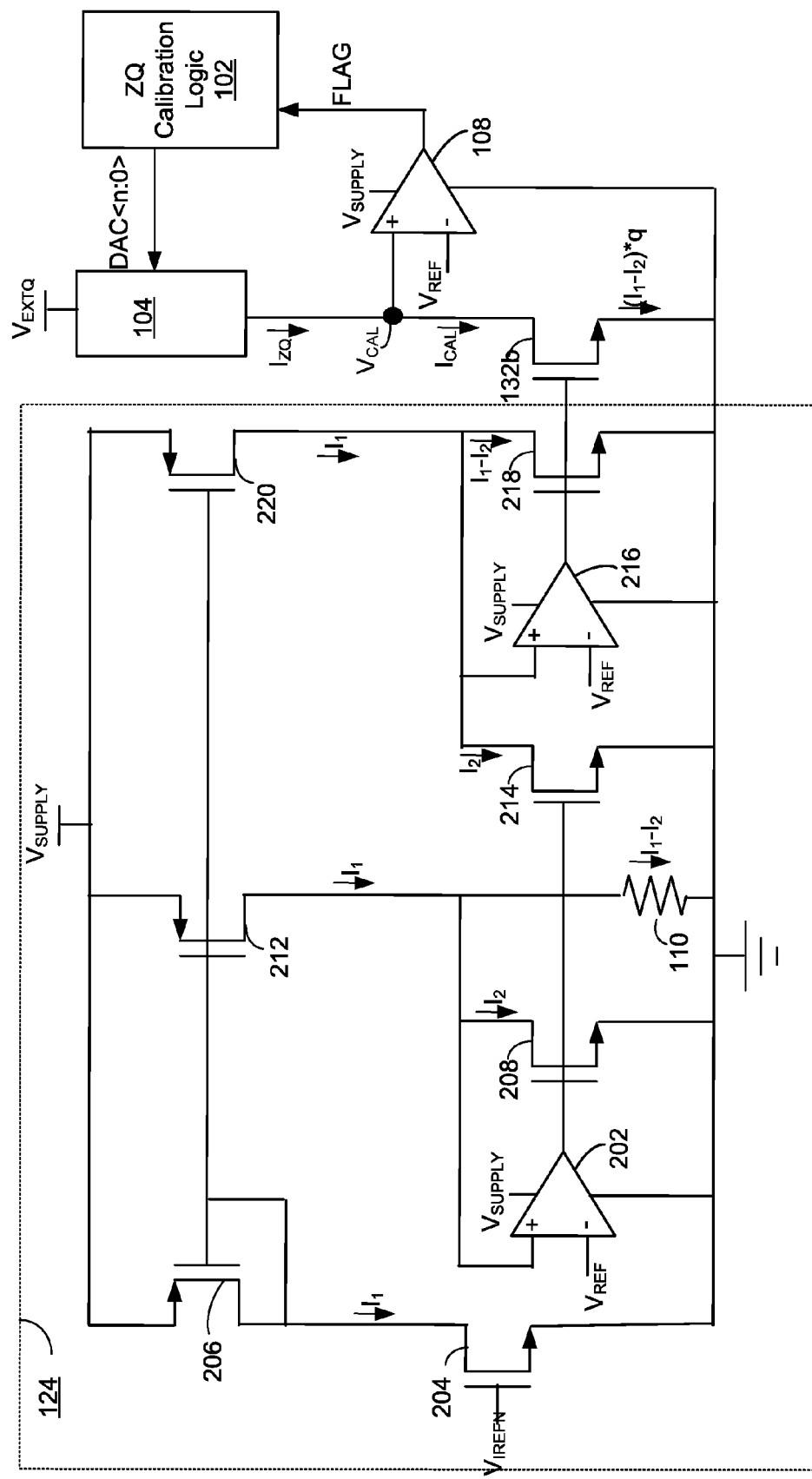
FIG. 2D depicts the circuitry of FIG. 2B with example currents.

FIG. 2D depicts the circuit of FIG. 2B with example current magnitudes, in accordance with one embodiment. The current magnitudes through circuit 124 are the same as the example of FIG. 2C. Note that these currents may apply both during ZQ calibration and when ZQ calibration is complete. After ZQ calibration is complete, the current in transistor 132b is "q" times the current in transistor 218. The parameter "q" is referred to as a current scaling factor. In one embodiment, the ratio of the size of transistor 132b to transistor 218 is selected to achieve the current scaling factor "q". The value of "q" is 6, as one example. This results in a calibration current $I_{CAL}$ of about 4.5 mA, in this example. In one embodiment, the variable impedance circuit 104 is calibrated to have an impedance of about 200 Ohms. If $V_{EXTQ}$ is 1.8V and $V_{REF}$ is 0.9V, this results in the ZQ current $I_{ZQ}$ being about 4.5 mA when the variable impedance circuit 104 is calibrated. Therefore, variable impedance circuit 104 is calibrated to supply 4.5 mA current when the voltage across the two terminals of variable impedance circuit 104 is equal to $V_{EXTQ}-V_{EXTQ}/2$ ($V_{REF}$ is configured to be equal to half of $V_{EXTQ}$, in this example).

FIG. 3A depicts one embodiment of on-chip calibration resistor 110. The on-chip calibration resistor 110 has a number of resistor legs 306 in parallel. One end of the resistor legs 306 is connected to a voltage terminal that provides $V_{REF}$. The other end of the resistor legs 306 is connected to a terminal that is grounded.

Some of the resistor legs 306 have a resistor and a selection transistor in series. The selection transistors are controlled by the TRIM code. For example, TRIM_0 is provided to the gate of selection transistor 314(0), TRIM_1 is provided to the gate of selection transistor 314(1), and TRIM_m is provided to the gate of selection transistor 314(m). In this example, the trim code is m+1 bits. Thus, resistors 304(0), 304(1), . . . 304(m) may be added to or removed from the network by selection of selection transistors 314(0), 314(1), . . . 314(m).

Resistor 302 does not have an associated selection transistor, such that it is always included. Resistor 302 is somewhat larger than the target resistance, in one embodiment. For example, resistor 302 could have a resistance that is about the target resistance divided by 0.7. For example, if the target resistance is 1200 Ohms, resistor 302 could have a resistance around 1715 Ohms.

Resistors 304(0), 304(1), . . . 304(m) may be binary weighted. For example, the resistance of resistor 304(0) may be "R", the resistance of resistor 304(1) may be "1/2*R", the resistance of resistor 304(m) may be "$1/(2^m)*R$". An example for "R" for these resistors may be about 114 k Ohms.

Resistor 302, as well as resistors 304(0), 304(1), . . . 304(m) are formed from polysilicon, in one embodiment. However, a different material may be used. In one embodiment, the polysilicon is doped with an impurity. Of course, due to process variation, the resistances of the various resistors may deviate from example target values listed above. For example, due to process variations, the actual resistances could be plus or minus about 30% from the foregoing example target values.

In the example of FIG. 3A, each bit of the trim code is used to select one selection transistor. In another embodiment, a set of one or more bits of the trim code is used to select $2^n-1$ selection transistors. For example, one bit may be used to select 1 selection transistor, two bits may be used to select 3 selection transistors, three bits may be used to select 7 selection transistors, four bits may be used to select 15 selection transistors, etc.

FIG. 3B is a diagram that depicts one embodiment in which a set of one or more bits of the trim code is used to select $2^n-1$ transistors. However, some of the trim code bits can still be used to select a single selection transistor. In the embodiment of FIG. 3B, TRIM_0 is used to select transistor 340, and TRIM_1 is used to select transistor 338. However, TRIM code bits<5:2> are used to select transistors 336(1), 336(2), . . . 336(15). Thus, four bits from the trim code are used to select 15 different transistors, in this example.

Resistor 330 has a resistance of "R" and resistor 328 has a resistance of "½ R", in this example. Resistors 326(1), 326(2), . . . 326(15) each have a resistance of "¼ R", in this example. Note that the smallest resistor in this example is "¼ R". This can provide greater precision than if smaller resistors are used.

Another difference between the circuit of FIGS. 3B and 3A is the inclusion of an additional resistor leg 306q. The additional resistor leg 306q is used to increase the accuracy of the on-chip calibration resistor 110. Its resistor 324 has a resistance of 2 R, in one embodiment. Thus, the resistance of resistor 324 may be double that of resistor 330. Note that the circuit of FIG. 3A could also include such a resistor leg 306q, as well.

The resistor leg 306q has select transistor 334, which is controlled by the signal TRIM_OC. Transistor 334 is turned on only during trimming of the on-chip calibration resistor 110, in one embodiment. Thus, transistor 334 is kept off during ZQ calibration, in one embodiment.

In one embodiment, the on-chip calibration resistor 110 has one or more additional resistor legs that are used to correct temperature variations. FIG. 3C depicts one embodiment of an on-chip calibration resistor 110 that may be able to correct both process and temperature variations. One of the additional resistor legs 306 has resistor 354(0) and transistor 356(0). The other depicted resistor leg 306 has resistor 354(t) and transistor 356(t). There are "t+1" additional resistor legs 306 for temperature compensation, in this embodiment. There is also a temperature code having "t+1" bits, in this embodiment.

In one embodiment, one of more of the additional resistor legs 306 is/are on for a default temperature. If the present temperature is greater than the default temperature, one or more additional resistor legs 306 are added to reduce the overall resistance, in one embodiment. If the present temperature is less than the default temperature, one or more additional resistor legs 306 are removed to increase the overall resistance, in one embodiment.

Figure 4:
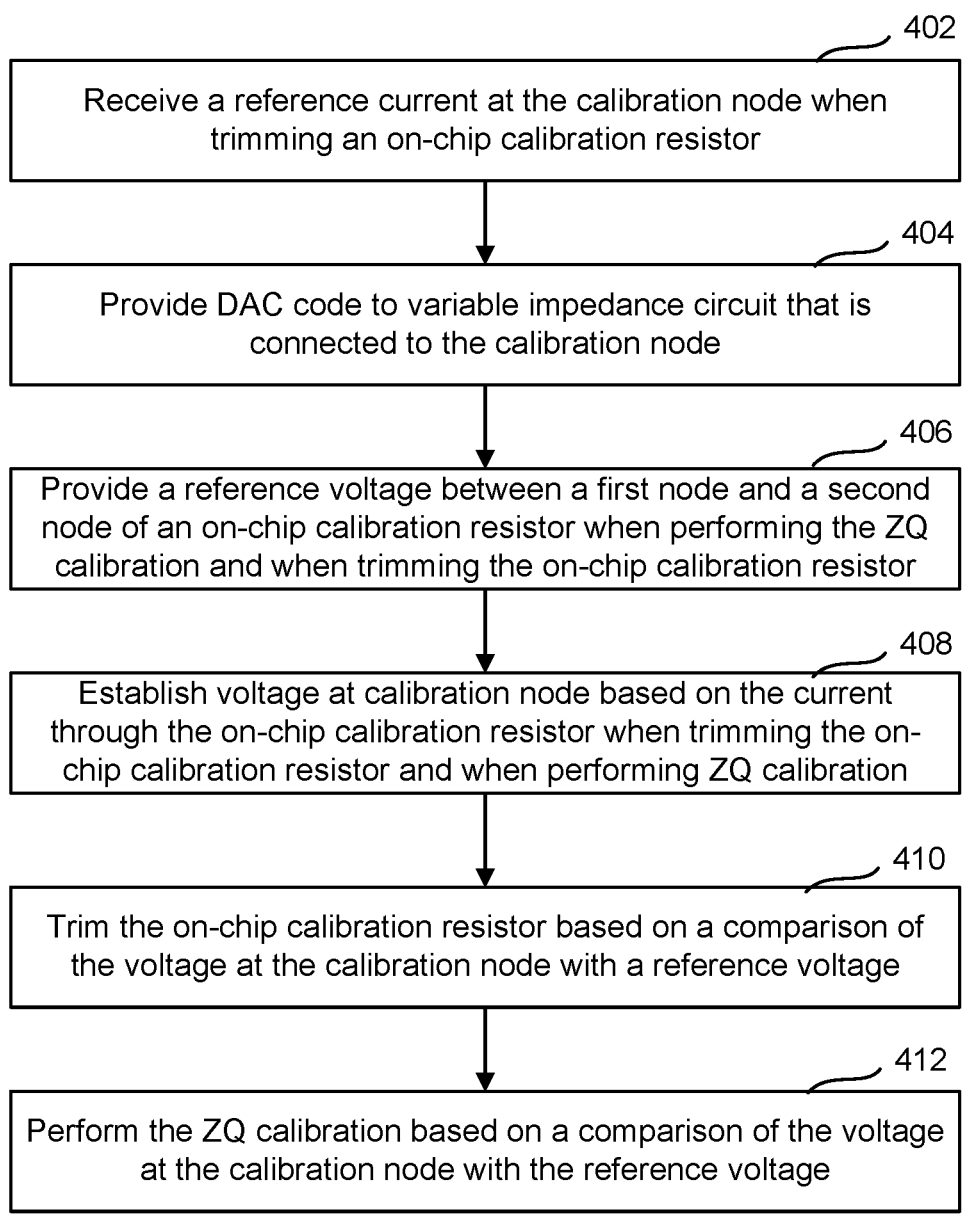
FIG. 4 is a flowchart of one embodiment of a process using common circuitry for both trimming an on-chip calibration resistor and using the on-chip calibration resistor for ZQ calibration.

FIG. 4 depicts a flowchart of one embodiment of a process 400 using common circuitry for both trimming an on-chip calibration resistor 110 and using the on-chip calibration resistor 110 for ZQ calibration. Reference will be made to elements in FIGS. 1 and 2A-2D. However, process 400 is not limited to that circuitry. The steps are described in this order to emphasize the dual use of the circuitry. Steps are typically not performed in the exact order depicted in FIG. 4. Steps 402 and 410 refer to steps while trimming the on-chip calibration resistor 110. Steps 404 and 412 refer to steps while performing a ZQ calibration. Steps 406 and 408 refer to steps performed both while trimming the on-chip calibration resistor 110 and while performing the ZQ calibration.

Step 402 is to receive a reference current (e.g., $I_{REF}$) at a calibration node when trimming the on-chip calibration resistor 110. The calibration node is at an input (e.g., non-inverting) of comparator 108. For example, $I_{REF}$ may be received from a high precision external current source. This may be received on a pin or pad of the chip. Step 402 is performed while trimming the on-chip calibration resistor 110. Step 402 may include connecting the calibration node to the high precision external current source.

Step 404 is to provide a DAC code to a variable impedance circuit 104 that is connected to the calibration node. This may result in a ZQ current (e.g., $I_{ZQ}$) at the calibration node when performing a ZQ calibration. The calibration node is at an input (e.g., non-inverting) of comparator 108. For example, $I_{ZQ}$ may be provided by variable impedance circuit 104. Step 404 is performed while performing ZQ calibration. Step 404 may include connecting the calibration node to the variable impedance circuit 104.

Step 406 is to provide a reference voltage between a first node and a second node of the on-chip calibration resistor 110. Step 406 is performed both while trimming the on-chip calibration resistor 110 and while performing the ZQ calibration. The same reference voltage (e.g., $V_{REF}$) is provided, in one embodiment. For example, operational amplifier 202 is configured in a feedback loop with transistor 208 to provide $V_{REF}$. Operational amplifier 202 and transistors 208, 212, 206 and 204 are one example of reference voltage circuitry configured to provide a reference voltage between the first node and the second node of the on-chip calibration resistor 110 to create a current through the on-chip calibration resistor.

Step 408 is to provide a calibration voltage (e.g., $V_{CAL}$) to the calibration node based on a current through the on-chip calibration resistor 110. Step 408 is performed both while trimming the on-chip calibration resistor 110 and while performing the ZQ calibration. When performing ZQ calibration, $V_{CAL}$ may depend on both the current through the on-chip calibration resistor 110 and the impedance of the variable impedance circuit 104. When performing on-chip calibration resistor trimming, $V_{CAL}$ may depend on both the current through the on-chip calibration resistor 110 and the reference current ($I_{REF}$). Note that the magnitude of the calibration current may be different for trimming the on-chip calibration resistor 110 compared to performing the ZQ calibration.

In one embodiment, step 408 includes generating a mirror current based on the current in the on-chip calibration resistor 110. This may include mirroring the current from transistor 212 into transistor 220, as well as splitting the current in transistor 212 between the on-chip calibration resistor 110 and transistor 208, and splitting the current in transistor 220 between transistor 218 and transistor 214. Together, transistors 208, 212, 214, 218, 220 and operational amplifier 216 may be referred to as current generation circuitry configured to generate a mirror current based on the current through the on-chip calibration resistor 110.

In step 410, the on-chip calibration resistor 110 is trimmed based on a comparison of the reference voltage (e.g., $V_{REF}$) and the calibration voltage (e.g., $V_{CAL}$). In one embodiment, the calibration voltage refers to the one provided by the drain to source voltage of transistor 132a. Step 410 may include comparing a voltage at the non-inverting input of comparator 108 with the voltage at the inverting input. In one embodiment, step 410 is performed when the device is manufactured.

In step 412, ZQ calibration is performed based on a comparison of the reference voltage (e.g., $V_{REF}$) and the calibration voltage (e.g., $V_{CAL}$). In one embodiment, the calibration voltage refers to the one provided by the drain to source voltage of transistor 132b. The voltage on calibration node ($V_{CAL}$) impacts both $I_{ZQ}$ and $I_{CAL}$. It settles at a level such that these two currents are equal. Step 412 may include comparing a voltage at the non-inverting input of comparator 108 with the voltage at the inverting input.

Figure 5:
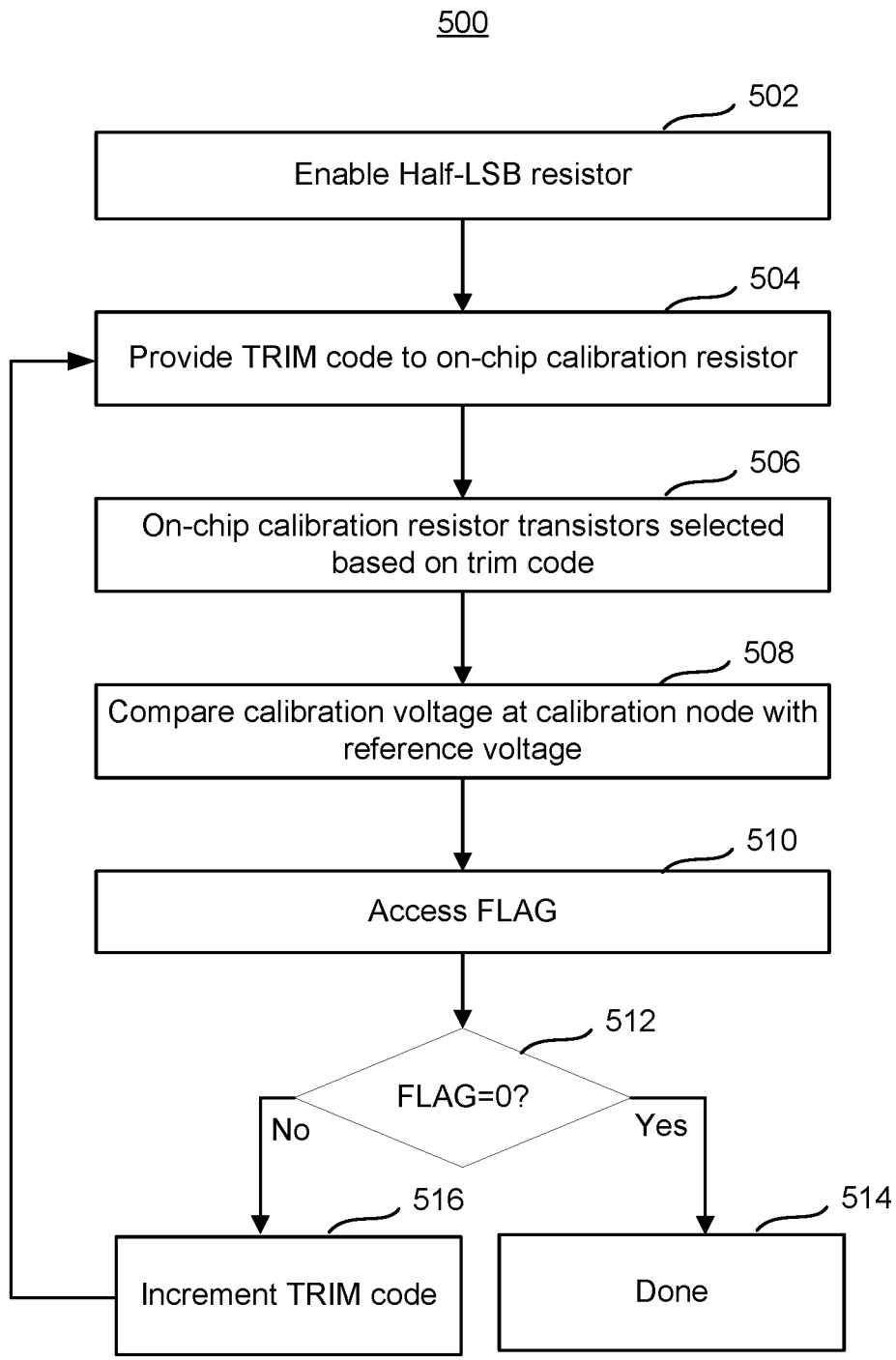
FIG. 5 is a flowchart of one embodiment of a process of steps performed during trimming of an on-chip calibration resistor.

FIG. 5 is a flowchart of one embodiment of a process 500 of steps performed during trimming of the on-chip calibration resistor 110. Process 500 may be used as one embodiment of step 410 from process 400. Prior to performing process 500, steps 402, 406, and 408 from process 400 may be performed.

In step 502, a half LSB (least significant bit) resistor is enabled. The half LSB resistor refers to one that has twice the resistance of the resistance in the resistor leg that is controlled by the LSB of the trim code, in one embodiment. The purpose of including half LSB resistor is to shift the trimming error from −1 LSB to 0 (or 0 to +1 LSB) to −½ LSB to +½ LSB. By centering the trimming error equally about 0, the absolute trimming error is cut down by half.

Referring to FIG. 3B, the signal TRIM_OC is used to turn on transistor 334, in one embodiment. This enables resistor 324. That is, resistor 324 is now connected between $V_{REF}$ and ground (via transistor 334).

In step 504, an initial trim code is provided to the on-chip calibration resistor 110. On chip resistor trimming logic 122 provides the initial trim code, in one embodiment. In one embodiment, the trim code has m+1 bits. The initial trim code could have any value. For example, if the trim code has six bits, then the initial trim code could be any value from 0 to 61. For the sake of illustration, process 500 will be discussed using an example in which the initial trim code is zero.

In step 506, the transistors of the on-chip calibration resistor 110 are selected based on the trim code. FIGS. 3A-3C show example on-chip calibration resistors 110 that may be used. Depending on the trim code, the selection of the transistors may cause certain resistors to be included and others to be excluded. Note that it is possible for all of the resistors to be included. It is also possible for none of the resistors that are in series with a transistor to be included. As a result of the new trim code, the resistance of the on-chip calibration resistor 110 is established. This, in turn, impacts the current ($I_{CR}$) in the on-chip calibration resistor 110. Therefore, the mirror current ($I_{MIR}$) is impacted. In one embodiment, $I_{MIR}$ may impact the gate to source voltage of transistor 218. Thus, $I_{MIR}$ may impact the gate to source voltage of transistor 132a. However, recall that $I_{CAL}$ may be essentially equal to $I_{REF}$. Thus, it is possible for $I_{CAL}$ to not be equal to $I_{MIR}$. The gate-to-source voltage of transistor 132a and its current ($I_{CAL}$) may impact its drain voltage. Ultimately, the voltage at the calibration node $V_{CAL}$ may impacted by the resistance of the on-chip calibration resistor. Thus, the voltage at the calibration node $V_{CAL}$ may depend on the resistance of the on-chip calibration resistor. Likewise, the voltage at the calibration node $V_{CAL}$ may depend on the current through the on-chip calibration resistor.

In step 508, the calibration voltage ($V_{CAL}$) is compared with the reference voltage ($V_{REF}$). For example, comparator 108 compares the magnitude of the calibration voltage ($V_{CAL}$) with the magnitude of the reference voltage ($V_{REF}$). Comparator 108 outputs a flag based on the comparison. For the sake of discussion, the flag has a value of "0" or "1". Step 508 may include the comparator 108 comparing the voltage at its non-inverting input with the voltage at its inverting input and output the flag based on the comparison.

In step 510, flag is accessed. For example, the on-chip resistor trimming logic 122 accesses the flag. Step 512 tests the value of the flag. If the flag has a value of 0, then the process concludes at step 514. If the flag does not have a value of 0, then the trim code is incremented in step 516. The process 500 then returns to step 504 to apply the new trim code to the on-chip calibration resistor 110.

Many variation of process 500 are possible. Process 500 discussed a linear search that scanned upwards through the trim code. However, the scan could go in the other direction through the trim code. A binary scan could be performed instead. With a binary scan, the scan might start at a midpoint of the trim code range. Depending on the value of flag, the trim code could be adjusted either upwards or downwards. The first adjustment could split the difference from the midpoint and an endpoint of the trim code range. The adjustments may be smaller with each iteration. Scans other than linear and binary might be performed.

FIG. 6A depicts one embodiment of the variable impedance circuit 104a of FIG. 1. In one embodiment, the variable impedance circuit 104a is a replica of an output buffer.

Hence, variable impedance circuit 104a may be referred to as a replica circuit. In one embodiment, it is a binary weighted pull-up replica. In one embodiment, variable impedance circuit 104a is a replica of on-die termination.

The variable impedance circuit 104a includes transistors 602-0, 602-1, 602-2, 602-3, 602-4, 602-5, and 602-6. In one embodiment, the transistors 602 are p-channel transistors. One terminal of each transistor 602 is connected to the supply voltage $V_{EXTQ}$. Another terminal of each transistor may be connected to a resistor 614(0)-614(6). The resistors 614 are connected to the calibration node. Alternatively, impedance circuit 104a may not have resistors. In such a case, the other terminal of each transistor 602 may connect directly to the calibration node. This refers to the calibration node in FIG. 1.

Note that for some output drivers, there is a 35 Ohm nominal drive specification at a condition of $V_{DS}=V_{EXTQ}/2$. The source may be connected to $V_{EXTQ}$ for the output drivers. Hence, the source of the transistors 602 may be connected to $V_{EXTQ}$. The calibration node, when proper calibration is reached, is at $V_{EXTQ}/2$, in one embodiment. In one embodiment, a goal of ZQ calibration is to find the impedance code when the calibration node is at $V_{EXTQ}/2$ and $I_{ZQ}$ equals $I_{CAL}$.

Each of the transistors 602 has its gate controlled by one of the bits of the impedance code DAC_P<n:0>. Transistor 602-0 has its gate controlled by DAC_P_0, which refers to the least significant bit of DAC_P<n:0>. Transistor 602-1 has its gate controlled by DAC_P_1. Transistor 602-2 has its gate controlled by DAC_P_2. Transistor 602-3 has its gate controlled by DAC_P_3. Transistor 602-4 has its gate controlled by DAC_P_4. Transistor 602-5 has its gate controlled by DAC_P_5. Transistor 602-6 has its gate controlled by DAC_P_6, which is the most significant bit of DAC_P<n:0>. The connections to the gates may be referred to as an input to the variable impedance circuit.

The value of the impedance code may be used to select which transistors 602 are on/off in order to control the impedance of circuit 104a. In one embodiment, the impedance code may be used to select which transistors 602 are on/off in order to control the output current of circuit 104a. Thus, circuit 104a may also be referred to as a variable current circuit.

The transistors may be "binary weighted" such that transistor 602-0 has a weight of "1", transistor 602-1 has a weight of "2", transistor 602-2 has a weight of "4", transistor 602-3 has a weight of "8", transistor 602-4 has a weight of "16", transistor 602-5 has a weight of "32", and transistor 602-6 has a weight of "64". By the weight it is meant the impact the transistor has on the impedance of the variable impedance circuit 104.

In one embodiment, the transistors 602 have a binary weighted channel width-to-length ratio (W/L). For example, the binary weighted channel W/L may be 1×, 2×, 4×, 8×, 16×, 32×, and 64×. The transistor W/L may also be referred to as transistor sizes.

In one embodiment, a transistor 602 is implemented by multiple transistors. Thus, each of the transistors 602 may represent one or more transistors. Moreover, there could be a binary relationship between the number of transistors used to implement transistors 602-0 through 602-6. For example, transistor 602-0 might be implemented with a single transistor, transistor 602-1 might be implemented with two transistors, transistor 602-2 might be implemented with four transistors, etc. In this example, each of the implementation transistors might have the same W/L.

In one embodiment, ZQ calibration involves NMOS trimming. The circuit of FIG. 2B may be modified to perform ZQ calibration for NMOS. One possible variation is to remove transistor 218 and operational amplifier 216. The drain of transistor 214 may be used as the calibration node. That node may be connected to either $I_{REF}$ (sink current) or ZQ current.

Figure 6B:
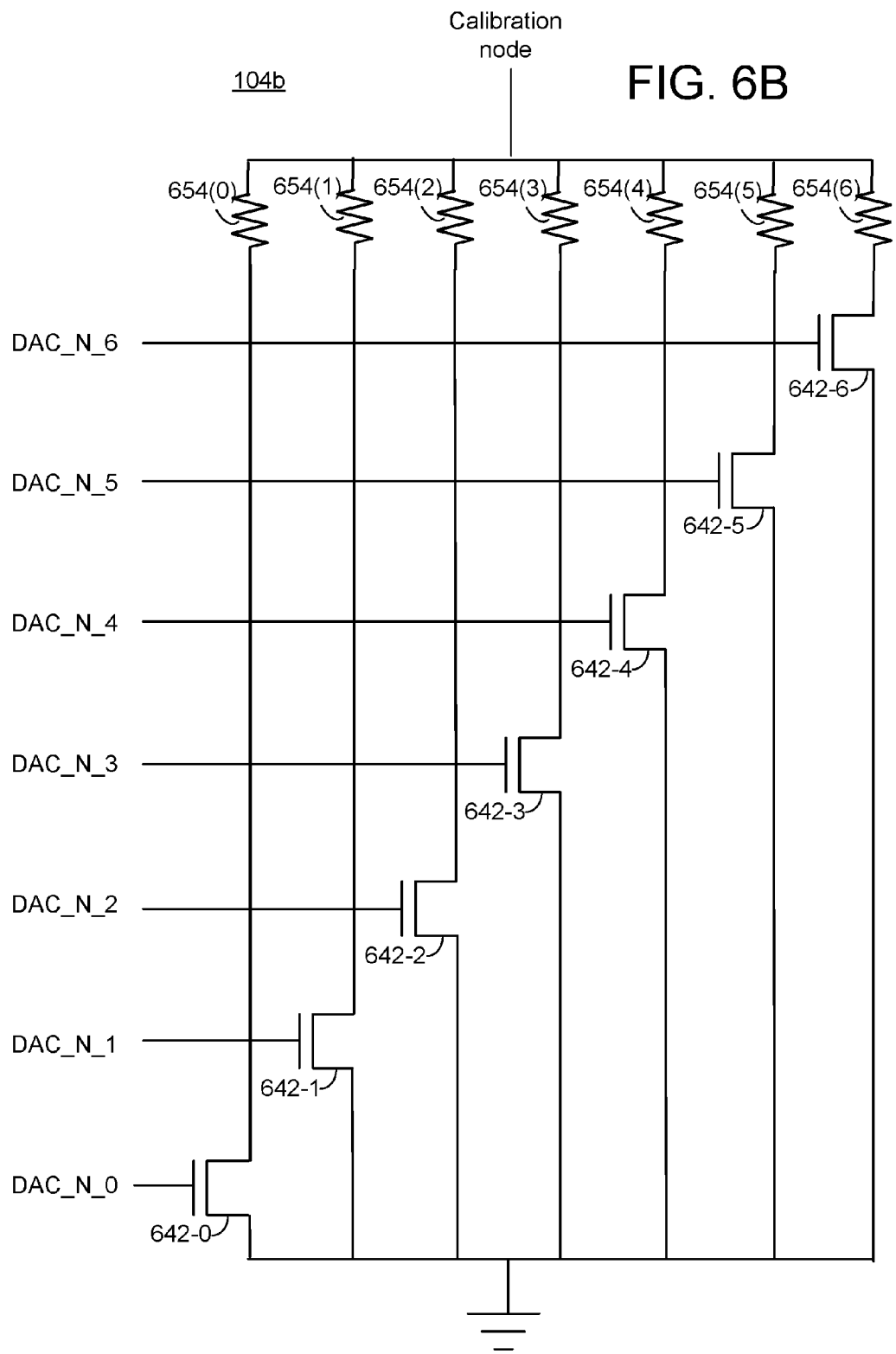
FIG. 6B depicts another embodiment of a variable impedance circuit.

FIG. 6B depicts one embodiment of a variable impedance circuit 104b for NMOS calibration. This circuit 104b may be used with a variation to the circuit of FIG. 1, or a variation of the circuit of FIG. 2B just discussed. In one embodiment, the variable impedance circuit 104b is a replica of an output buffer. Hence, variable impedance circuit 104b may be referred to as a replica circuit. In one embodiment, it is a binary weighted pull-down replica. In one embodiment, variable impedance circuit 104b is a replica of on-die termination.

The variable impedance circuit 104b includes transistors 642-0, 642-1, 642-2, 642-3, 642-4, 642-5, and 642-6. In one embodiment, the transistors 642 are n-channel transistors. One terminal of each transistor 642 is connected to ground. Another terminal of each transistor may be connected to a resistor 654(0)-654(6). The resistors 654 are connected to the calibration node. Alternatively, one terminal of transistors 642 may be connected directly to the calibration node, in case there are no resistors in the circuit.

Each of the transistors 642 has its gate controlled by one of the bits of the impedance code DAC_N<n:0>. Transistor 642-0 has its gate controlled by DAC_N_0, which refers to the least significant bit of DAC_N<n:0>. Transistor 642-1 has its gate controlled by DAC_N_1. Transistor 642-2 has its gate controlled by DAC_N_2. Transistor 642-3 has its gate controlled by DAC_N_3. Transistor 642-4 has its gate controlled by DAC_N_4. Transistor 642-5 has its gate controlled by DAC_N_5. Transistor 642-6 has its gate controlled by DAC_N_6, which is the most significant bit of DAC_N<n:0>. The connections to the gates may be referred to as an input to the variable impedance circuit.

The value of the impedance code may be used to select which transistors 642 are on/off in order to control the impedance of circuit 104b. In one embodiment, the impedance code may be used to select which transistors 642 are on/off in order to control the output current of circuit 104b.

The transistors may be "binary weighted" such that transistor 642-0 has a weight of "1", transistor 642-1 has a weight of "2", transistor 642-2 has a weight of "4", transistor 642-3 has a weight of "8", transistor 642-4 has a weight of "16", transistor 642-5 has a weight of "32", and transistor 642-6 has a weight of "64". By the weight it is meant the impact the transistor has on the impedance of the variable impedance circuit 104.

In one embodiment, the transistors 642 have a binary weighted channel width-to-length ratio (W/L). For example, the binary weighted channel W/L may be 1×, 2×, 4×, 8×, 16×, 32×, and 64×. The transistor W/L may also be referred to as transistor sizes.

In one embodiment, a transistor 642 is implemented by multiple transistors. Thus, each of the transistors 642 may represent one or more transistors. Moreover, there could be a binary relationship between the number of transistors used to implement transistors 642-0 through 642-6. For example, transistor 642-0 might be implemented with a single transistor, transistor 642-1 might be implemented with two transistors, transistor 642-2 might be implemented with four transistors, etc. In this example, each of the implementation transistors might have the same W/L.

Figure 7:
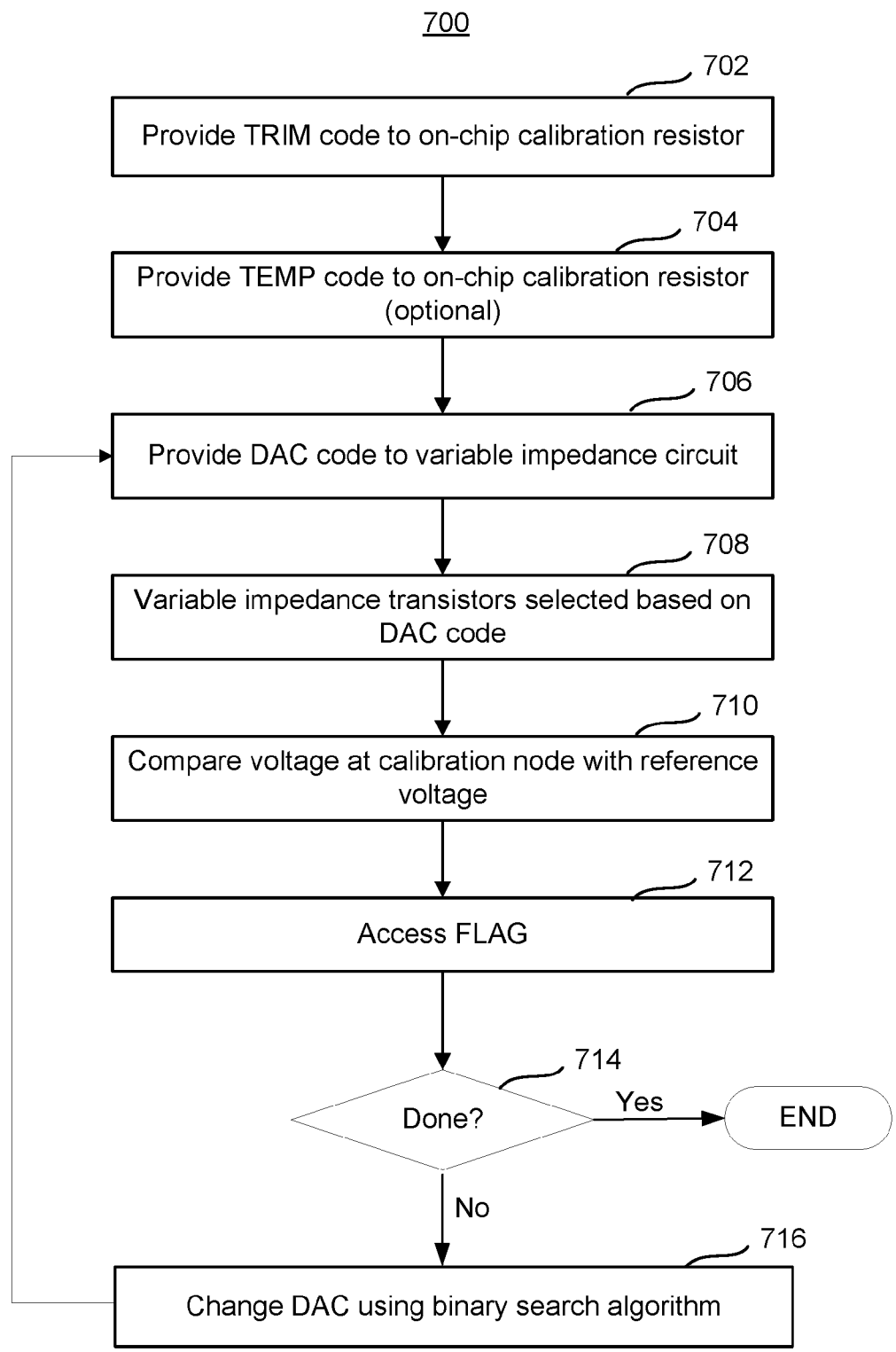
FIG. 7 is a flowchart of one embodiment of a process of performing a ZQ calibration.

FIG. 7 is a flowchart of one embodiment of a process 700 of steps performing a ZQ calibration. Process 700 may be used as one embodiment of step 412 from process 400. Prior to performing process 700, steps 404, 406, and 408 from process 400 may be performed.

In step 702, a trim code is provided to an on-chip calibration resistor 110. This is the trim code determined by process 500, in one embodiment. In optional step 704, a TEMP code is provided to the on-chip calibration resistor 110. The TEMP code is used to compensate for temperature variations.

In step 706, a DAC code is provided to the variable impedance circuit 104. In process 700, a binary search is performed. Hence, the initial value may be the midpoint of the range of values in the DAC code.

In step 708, the transistors of the variable impedance circuit 104 are selected based on the DAC code. FIG. 6A shows one example variable impedance circuit 104 that may be used. Depending on the DAC code, the selection of the transistors may cause certain transistors 602 or 642 to be included and other to be excluded. As a result of the DAC code, the impedance of variable impedance circuit 104 is established. This, in turn, may impact the voltage at the calibration node. Note that $V_{CAL}$ may depend on both the magnitude of $I_{CAL}$ and the impedance of variable impedance circuit 104.

In step 710, the calibration voltage ($V_{CAL}$) is compared with the reference voltage ($V_{REF}$). For example, comparator 108 compares the magnitude of the calibration voltage ($V_{CAL}$) at its non-inverting input with the magnitude of the reference voltage ($V_{REF}$) at its inverting input. Comparator 108 outputs a flag based on the comparison. For the sake of discussion, the flag has a value of "0" or "1".

In step 712, flag is accessed. For example, the ZQ calibration logic 102 accesses the flag. Step 714 is a test to determine whether the process 700 is complete. In one embodiment, a pre-determined number of iterations are performed. If the process 700 is not done, step 716 is performed.

Step 716 includes changing the DAC code using a binary search algorithm. The DAC code may be adjusted either up or down, based on the value of the flag. The process 700 then returns to step 706, to provide the updated DAC code to the variable impedance circuit 104.

Some embodiments are practiced in a memory device. The following discussion provides details of the structure of example memory devices which can implement the proposed technology for trimming an on-chip calibration resistor.

Figure 8A:
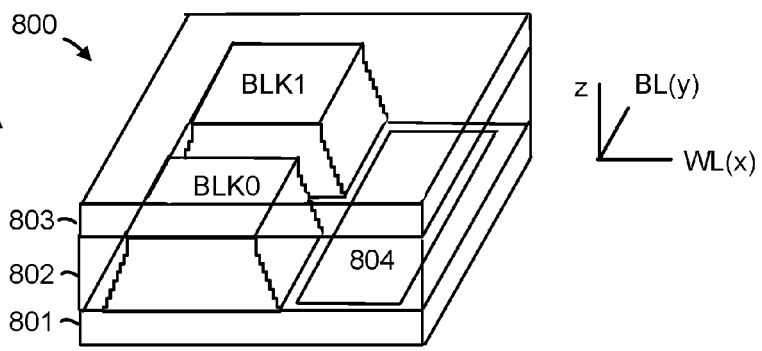
FIG. 8A is a perspective view of a 3D stacked non-volatile memory device.

FIG. 8A is a perspective view of a 3D stacked non-volatile memory device. The memory device 800 includes a substrate 801. On and above the substrate are example blocks BLK0 and BLK1 of memory cells (non-volatile storage elements). Also on the substrate is a peripheral area 804 with circuitry for use by the blocks. The substrate 801 can also carry circuitry under the blocks, along with one or more lower metal layers which are patterned in conductive paths to carry signals of the circuitry. The blocks are formed in an intermediate region 802 of the memory device. In an upper region 803 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions. Additionally, note that components are considered to be connected if they are directly connected or indirectly connected.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 8B:
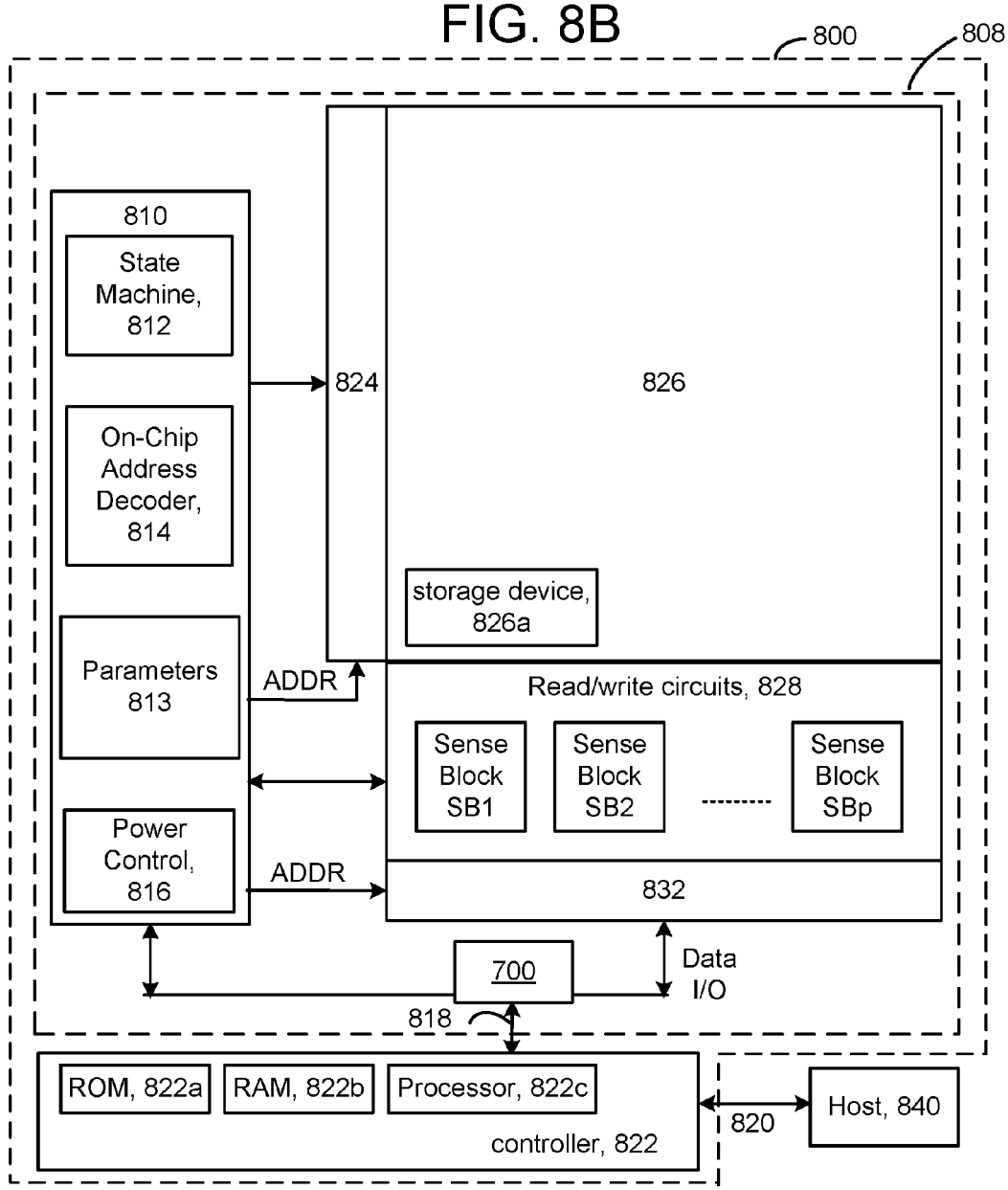
FIG. 8B is a functional block diagram of a memory device such as the 3D stacked non-volatile memory device of FIG. 8A.

FIG. 8B is a functional block diagram of a memory device 800 such as the 3D stacked non-volatile memory device 800 of FIG. 8A. The memory device 800 may include one or more memory die 808. The memory die 808 includes a memory structure 826 of memory cells, such as an array of memory cells, control circuitry 810, and read/write circuits 828. In a 3D configuration, the memory structure can include the blocks BLK0 and BLK1 of FIG. 8A. The memory structure 826 is addressable by word lines via a row decoder 824 and by bit lines via a column decoder 832. The read/write circuits 828 include multiple sense blocks SB1, SB2, . . . , SBp (sensing circuitry) and allow a page of memory cells to be read or programmed in parallel. Typically a controller 822 is included in the same memory device 800 (e.g., a removable storage card) as the one or more memory die 808. In some embodiments, one controller will communicate with multiple memory die. Commands and data are transferred between the host 840 and controller 822 via a data bus 820 and between the controller and the one or more memory die 808 via lines 818. The memory die has I/O circuity 700, in one embodiment. I/O circuity 700 may contain output buffers. In one embodiment, a ZQ calibration of the output buffers is performed using the circuit of FIG. 1.

Memory structure 826 can be a two dimensional structure or a three dimensional structure of memory cells (e.g., NAND flash memory cells). The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 810 cooperates with the read/write circuits 828 to perform memory operations on the memory structure 826, and includes a state machine 812, an on-chip address decoder 814, and a power control module 816. The state machine 812 provides chip-level control of memory operations. Parameter storage 813 may be provided for storing operational parameters.

The on-chip address decoder 814 provides an address interface between that used by the host or a memory controller to the hardware address used by the decoders 824 and 832. The power control module 816 controls the power and voltages supplied to the word lines and bit lines during memory operations. It can include drivers for word line layers (WLLs) in a 3D configuration, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In various embodiments, one or more of control circuitry 810, state machine 812, decoders 814/824/832, power control module 816, sense blocks SB1, SB2, . . . , SBp, read/write circuits 828, and controller 822 can be thought of as at least one or more control circuits.

The off-chip controller 822 may comprise a processor 822c and storage devices (memory) such as ROM 822a and RAM 822b. The storage devices comprises code such as a set of instructions, and the processor 822c is operable to execute the set of instructions to provide the functionality described herein. Alternatively or additionally, processor 822c can access code from a storage device 826a of the memory structure, such as a reserved area of memory cells in one or more word lines.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND flash memory) typically contain memory elements connected in series. A NAND string is an example of a set of series-connected transistors comprising memory cells and select gate transistors.

A NAND flash memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 9:
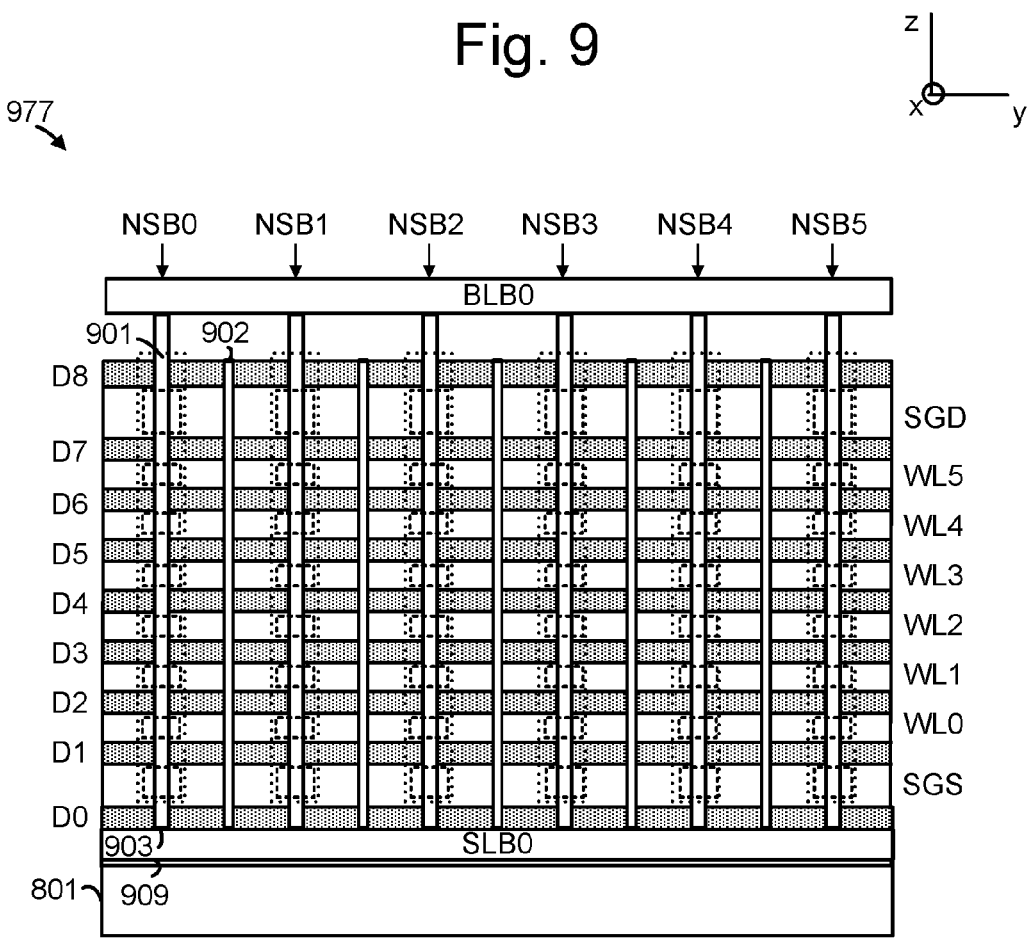
FIG. 9 depicts a cross-sectional view of a block of the 3D non-volatile memory device of having straight strings.

FIG. 9 depicts a cross-sectional view of a block of the 3D non-volatile memory device of having straight strings. The block contains a number of non-volatile storage elements. This is one example that can be used in the memory array in FIG. 8B. The stack 977 contains alternating layers of conductive (SGS, WL0-WL5, SGD) and insulating (D0-D8) layers. The conductive could be tungsten, highly doped silicon, etc. The insulating layers could be silicon nitride, etc. Columns of memory cells corresponding to NAND strings NSB0 to NSB5, respectively, are depicted in the multi-layer stack. The stack 977 includes a substrate 801, an insulating film 909 on the substrate, and a portion of a source line SLB0. The NAND strings NSB0 to NSB5 are each in a different sub-block, but are in a common set of NAND strings. NSB0 has a source end 903 and a drain end 901. A slit 902 is also depicted with other slits. Slits may be formed from an insulator, such as silicon oxide. A portion of the bit line BLB0 is also depicted. Dashed lines depict memory cells and select gates. Memory cells in layers WL0-WL5. Select gates are in layers SGS and SGD.

A variable impedance means for providing a variable impedance at a calibration node when performing a ZQ calibration, in various embodiments, may include variable impedance circuit 104, ZQ calibration logic 102, transistors 602, resistors 614, switch 1, transistor(s) for implementing switch 1, and/or other hardware. Other embodiments may include similar or equivalent means for providing a variable impedance at a calibration node when performing a ZQ calibration.

A reference current receiving means for receiving a reference current at the calibration node when trimming an on-chip calibration resistor, in various embodiments, may include input pad 111, an input pin, switch 2, transistors, transistor(s) for implementing switch 2, state machine 812, processor 822c, ROM 822a, RAM 822b and/or other hardware, and/or other hardware. Other embodiments may include similar or equivalent means for reference current receiving means for receiving a reference current at the calibration node when trimming an on-chip calibration resistor.

A reference voltage providing means for providing a reference voltage between a first node and a second node of an on-chip calibration resistor to create a current in the on-chip calibration resistor when performing the ZQ calibration and also when trimming the on-chip calibration resistor, in various embodiments, may include operational amplifier 202, transistor 208, other transistors, and/or other hardware. Other embodiments may include similar or equivalent means for reference voltage providing means for providing a reference voltage between a first node and a second node of an on-chip calibration resistor to create a current in the on-chip calibration resistor when performing the ZQ calibration and also when trimming the on-chip calibration resistor.

A calibration voltage providing means for providing a calibration voltage to the calibration node based on the current in the on-chip calibration resistor and the impedance of the variable impedance means when performing the ZQ calibration, wherein the calibration voltage providing means is further used for providing a calibration voltage to the calibration node based on the current in the on-chip calibration resistor and the reference current when trimming the on-chip calibration resistor, in various embodiments, may include on-chip resistor signal circuit 124, on-chip resistor signal scaling 132, operational amplifiers, transistors, current mirrors, operational amplifier 216, transistor 212, transistor 208, transistor 214, transistor 220, transistor 218, transistor 132a, transistor 132b, and/or other hardware. Other embodiments may include similar or equivalent means for calibration voltage providing means for providing a calibration voltage to the calibration node based on the current in the on-chip calibration resistor and the impedance of the variable impedance means when performing the ZQ calibration and for providing a calibration voltage to the calibration node based on the current in the on-chip calibration resistor and the reference current when trimming the on-chip calibration resistor.

A ZQ calibration means for performing the ZQ calibration based on a comparison of the calibration voltage with the reference voltage, in various embodiments, may include variable impedance circuit 104, ZQ calibration logic 102, switch 3, comparator 108, transistors 642, transistors 602, resistors 614, resistors 654, a state machine 812, processor 822c, ROM 822a, RAM 822b and/or other hardware. Other embodiments may include similar or equivalent means for performing the ZQ calibration based on a comparison of the calibration voltage with the reference voltage.

An on-chip calibration resistor trimming means for trimming the on-chip calibration resistor based on a comparison of the reference voltage with the calibration voltage, in various embodiments, may include on-chip resistor trimming logic 122, switch 3, comparator 108, a state machine 812, processor 822c, ROM 822a, RAM 822b and/or other hardware. Other embodiments may include similar or equivalent means for trimming the on-chip calibration resistor based on a comparison of the reference voltage with the calibration voltage.

One embodiment disclosed herein includes an apparatus comprising an on-chip calibration resistor, a variable impedance circuit coupled to a calibration node, circuitry configured to establish a voltage at the calibration node based on a current in the on-chip calibration resistor and a reference current when the apparatus is in a first mode, circuitry configured to establish a voltage at the calibration node based on a current in the on-chip calibration resistor and an impedance of the variable impedance circuit when the apparatus is in a second mode, a comparator configured to compare the voltage at the calibration node with a reference voltage when the apparatus is in the first mode and in the second mode, circuitry configured to trim the on-chip calibration resistor based on the comparison of the reference voltage with the calibration voltage when the apparatus is in the first mode, and circuitry configured to perform a ZQ calibration based on the comparison of the voltage at the calibration node with the reference voltage when the apparatus is in the second mode.

One embodiment disclosed herein includes a non-volatile storage device comprising a plurality of non-volatile storage elements, an on-chip calibration resistor having a first node and second node, a variable impedance circuit coupled to a calibration node. The variable impedance circuit has an input configured to receive a ZQ impedance code. The variable impedance circuit is configured to alter its impedance based on the ZQ impedance code. The non-volatile storage device further comprises reference voltage circuitry configured to provide a reference voltage between the first node and the second node of the on-chip calibration resistor to create a current through the on-chip calibration resistor, current generation circuitry configured to generate a second current based on the current through the on-chip calibration resistor, calibration voltage providing circuitry configured to provide a calibration voltage to the calibration node based on the second current and the impedance of the variable impedance circuit and to provide a calibration voltage to the calibration node based on the second current and a reference current, ZQ calibration circuitry configured to perform a ZQ calibration based on a comparison of the calibration voltage and the reference voltage, and on-chip calibration circuitry configured to trim the on-chip calibration resistor based on a comparison of the calibration voltage and the reference voltage.

One embodiment disclosed herein includes a method comprising receiving a reference current at a calibration node when trimming an on-chip calibration resistor, providing a trim code to a variable impedance circuit coupled to the calibration node when performing a ZQ calibration, providing a reference voltage between a first node and a second node of an on-chip calibration resistor when performing the ZQ calibration and also when trimming the on-chip calibration resistor, providing a calibration voltage to the calibration node based on a current through the on-chip calibration resistor and an impedance of the variable impedance circuit when performing the ZQ calibration, providing a calibration voltage to the calibration node based on a current through the on-chip calibration resistor and the reference current when trimming the on-chip calibration resistor, trimming the on-chip calibration resistor based on a comparison of the reference voltage with the calibration voltage, and performing the ZQ calibration based on a comparison of the reference voltage with the calibration voltage.

One embodiment disclosed herein includes a non-volatile storage device comprising variable impedance means for providing a variable impedance at a calibration node when performing a ZQ calibration, reference current receiving means for receiving a reference current at the calibration node when trimming an on-chip calibration resistor, reference voltage providing means for providing a reference voltage between a first node and a second node of an on-chip calibration resistor to create a current in the on-chip calibration resistor when performing the ZQ calibration and also when trimming the on-chip calibration resistor, calibration voltage providing means for providing a calibration voltage to the calibration node based on the current in the on-chip calibration resistor and the impedance of the variable impedance means when performing the ZQ calibration, wherein the calibration voltage providing means is further used for providing a calibration voltage to the calibration node based on the current in the on-chip calibration resistor and the reference current when trimming the on-chip calibration resistor, ZQ calibration means for performing the ZQ calibration based on a comparison of the calibration voltage with the reference voltage, and on-chip calibration resistor trimming means for trimming the on-chip calibration resistor based on a comparison of the reference voltage with the calibration voltage.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:
1. An apparatus comprising:
an on-chip calibration resistor;
a variable impedance circuit coupled to a calibration node;
circuitry configured to establish a voltage at the calibration node based on a current in the on-chip calibration resistor and a reference current when the apparatus is in a first mode;
circuitry configured to establish a voltage at the calibration node based on a current in the on-chip calibration resistor and an impedance of the variable impedance circuit when the apparatus is in a second mode;
a comparator configured to compare the voltage at the calibration node with a reference voltage when the apparatus is in the first mode and in the second mode;
circuitry configured to trim the on-chip calibration resistor based on the comparison of the voltage at the calibration node with the reference voltage when the apparatus is in the first mode; and
circuitry configured to perform a ZQ calibration based on the comparison of the voltage at the calibration node with the reference voltage when the apparatus is in the second mode.

2. The apparatus of claim 1, wherein the circuitry configured to establish a voltage at the calibration node based on a current in the on-chip calibration resistor and a reference current when the apparatus is in the first mode comprises: first scaling circuitry configured to scale a mirrored current derived from the current in the on-chip calibration resistor by a first factor and provide the scaled current to the calibration node when the apparatus is in the first mode and trimming the on-chip calibration resistor is complete;
wherein the circuitry configured to establish a voltage at the calibration node based on a current in the on-chip calibration resistor and an impedance of the variable impedance circuit comprises: second scaling circuitry configured to scale the mirrored current derived from the current in the on-chip calibration resistor by a second factor and provide the scaled current to the calibration node when the apparatus is in the second mode and the ZQ calibration is complete.

3. The apparatus of claim 1, wherein the circuitry configured to generate the voltage at the calibration node from the current in the on-chip calibration resistor comprises:
an operational amplifier that is used in the first mode and in the second mode.

4. The apparatus of claim 1, wherein the circuitry configured to generate the voltage at the calibration node from the current in the on-chip calibration resistor comprises:
a current mirror that is used in the first mode and in the second mode.

5. The apparatus of claim 1, wherein the on-chip calibration resistor comprises:
an input configured to receive a trim code;
a plurality of resistors; and
a plurality of transistors that are controlled by the trim code, wherein the transistors include or exclude the resistors based on the trim code to trim the on-chip calibration resistor.

6. The apparatus of claim 5, wherein the circuitry configured to trim the on-chip calibration resistor is configured to determine the trim code, wherein the apparatus is configured to provide the trim code to the on-chip calibration resistor while performing the ZQ calibration.

7. The apparatus of claim 5, wherein the on-chip calibration resistor further comprises:
an input configured to receive a temperature code that is based on a present temperature;
at least one additional resistor; and
at least one additional transistor, wherein the at least one additional transistor is controlled by the temperature code to include or exclude the at least one additional resistor to change the resistance of on-chip calibration resistor to account for temperature variation.

8. The apparatus of claim 1, further comprising:
a three-dimensional memory array comprising a plurality of non-volatile storage elements.

9. A non-volatile storage device comprising:
a plurality of non-volatile storage elements;
an on-chip calibration resistor having a first node and a second node;
a variable impedance circuit coupled to a calibration node, wherein the variable impedance circuit has an input configured to receive a ZQ impedance code, wherein the variable impedance circuit is configured to alter its impedance based on the ZQ impedance code;
reference voltage circuitry configured to provide a first reference voltage between the first node and the second node of the on-chip calibration resistor to create a current through the on-chip calibration resistor;
current generation circuitry configured to generate a second current based on the current through the on-chip calibration resistor;
calibration voltage providing circuitry configured to provide a calibration voltage to the calibration node based on the second current and the impedance of the variable impedance circuit and to provide a calibration voltage to the calibration node based on the second current and a reference current;
ZQ calibration circuitry configured to perform a ZQ calibration based on a comparison of the calibration voltage and a second reference voltage; and
on-chip resistor calibration circuitry configured to trim the on-chip calibration resistor based on a comparison of the calibration voltage and the second reference voltage.

10. The non-volatile storage device of claim 9, wherein the circuitry configured to perform the ZQ calibration comprises a comparator configured to compare the second reference voltage with the calibration voltage when the ZQ calibration is performed, wherein the comparator is configured to compare the second reference voltage with the calibration voltage when the on-chip calibration resistor is trimmed.

11. The non-volatile storage device of claim 9, wherein the circuitry configured to provide the first reference voltage between the first node and the second node of the on-chip calibration resistor comprises an operational amplifier configured to provide the first reference voltage when the ZQ calibration is performed and also when the on-chip calibration resistor is trimmed.

12. The non-volatile storage device of claim 9, wherein the circuitry configured to generate the second current comprises an operational amplifier configured to provide the first reference voltage to a node that provides the second current when the ZQ calibration is performed and also when the on-chip calibration resistor is trimmed.

13. The non-volatile storage device of claim 9, wherein the circuitry configured to generate the second current comprises a current mirror that is used to generate the second current when the ZQ calibration is performed and also when the on-chip calibration resistor is trimmed.

14. The non-volatile storage device of claim 9, wherein the circuitry configured to provide the calibration voltage to the calibration node based on the second current comprises:
first scaling circuitry configured to scale the second current by a first factor when trimming the on-chip calibration resistor is complete; and
second scaling circuitry configured to scale the second current by a second factor when performing the ZQ calibration is complete.

15. The non-volatile storage device of claim 9, wherein the on-chip calibration resistor comprises:
an input configured to receive a trim code; and
a plurality of resistor legs in parallel, each of the resistor legs comprising a resistor, at least some of the resistor legs comprising a selection transistor in series with the resistor of that leg, wherein the selection transistors are configured to be controlled by the trim code to select resistors in the plurality of resistor legs.

16. A method comprising:
receiving a reference current at a calibration node when trimming an on-chip calibration resistor;
providing a impedance code to a variable impedance circuit coupled to the calibration node when performing a ZQ calibration;
providing a first reference voltage between a first node and a second node of the on-chip calibration resistor when performing the ZQ calibration and also when trimming the on-chip calibration resistor;
providing a calibration voltage to the calibration node based on a current through the on-chip calibration resistor and an impedance of the variable impedance circuit when performing the ZQ calibration;
providing a calibration voltage to the calibration node based on a current through the on-chip calibration resistor and the reference current when trimming the on-chip calibration resistor;
trimming the on-chip calibration resistor based on a comparison of a second reference voltage with the calibration voltage; and
performing the ZQ calibration based on a comparison of the second reference voltage with the calibration voltage.

17. The method of claim 16, wherein the providing the calibration voltage to the calibration node based on the current through the on-chip calibration resistor when performing the ZQ calibration and also when trimming the on-chip calibration resistor comprises:

scaling a mirrored version of the current through the on-chip calibration resistor by a first factor when trimming the on-chip calibration resistor is complete; and scaling a mirrored version of the current through the on-chip calibration resistor by a second factor when performing the ZQ calibration is complete.

18. The method of claim 16, wherein the trimming the on-chip calibration resistor and the performing the ZQ calibration comprise using the same comparator to compare the second reference voltage with the calibration voltage both when trimming the on-chip calibration resistor and performing the ZQ calibration.

19. The method of claim 16, wherein the providing the calibration voltage to the calibration node comprises:

using a common operational amplifier and a common current mirror to generate a mirrored version of the current through the on-chip calibration resistor when performing the ZQ calibration and also when trimming the on-chip calibration resistor.

20. A non-volatile storage device comprising:

variable impedance means for providing a variable impedance at a calibration node when performing a ZQ calibration;

reference current receiving means for receiving a reference current at the calibration node when trimming an on-chip calibration resistor;

reference voltage providing means for providing a first reference voltage between a first node and a second node of the on-chip calibration resistor to create a current in the on-chip calibration resistor when performing the ZQ calibration and also when trimming the on-chip calibration resistor;

calibration voltage providing means for providing a calibration voltage to the calibration node based on the current in the on-chip calibration resistor and the impedance of the variable impedance means when performing the ZQ calibration, wherein the calibration voltage providing means is further used for providing a calibration voltage to the calibration node based on the current in the on-chip calibration resistor and the reference current when trimming the on-chip calibration resistor;

ZQ calibration means for performing the ZQ calibration based on a comparison of the calibration voltage with a second reference voltage; and on-chip calibration resistor trimming means for trimming the on-chip calibration resistor based on a comparison of the second reference voltage with the calibration voltage.

* * * * *